US009748266B1

(12) United States Patent
Baraskar et al.

(10) Patent No.: US 9,748,266 B1
(45) Date of Patent: Aug. 29, 2017

(54) THREE-DIMENSIONAL MEMORY DEVICE WITH SELECT TRANSISTOR HAVING CHARGE TRAPPING GATE DIELECTRIC LAYER AND METHODS OF MAKING AND OPERATING THEREOF

(71) Applicant: SANDISK TECHNOLOGIES LLC, Plano, TX (US)

(72) Inventors: Ashish Baraskar, Santa Clara, CA (US); Yanli Zhang, San Jose, CA (US); Liang Pang, Milpitas, CA (US); Ching-Huang Lu, Fremont, CA (US); Matthias Baenninger, Palo Alto, CA (US); Yingda Dong, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 15/215,080

(22) Filed: Jul. 20, 2016

(51) Int. Cl.
*H01L 27/11582* (2017.01)
*H01L 21/02* (2006.01)
(Continued)

(52) U.S. Cl.
CPC .. *H01L 27/11582* (2013.01); *H01L 21/02164* (2013.01); *H01L 21/02271* (2013.01); *H01L 21/28282* (2013.01); *H01L 27/1157* (2013.01)

(58) Field of Classification Search
CPC .......... H01L 27/11578; H01L 27/1158; H01L 27/11582; H01L 27/1157; H01L 27/0688;
(Continued)

(56) References Cited

U.S. PATENT DOCUMENTS 5,915,167 A 6/1999 Leedy
7,005,350 B2 2/2006 Walker et al.
(Continued)

FOREIGN PATENT DOCUMENTS

JP 2014-057067 A 3/2014
KR 20100109745 A 10/2010
(Continued)

OTHER PUBLICATIONS

Invitation to Pay Additional Search Fees issued in PCT Application No. PCT/US13/41410, mailed Sep. 9, 2013.(6 pp.).
(Continued)

*Primary Examiner* — Tucker J Wright
(74) *Attorney, Agent, or Firm* — The Marbury Law Group PLLC

(57) ABSTRACT

A gate dielectric layer including a tunneling gate dielectric layer, a charge trapping gate dielectric layer, and a cap gate dielectric layer is formed on a horizontal semiconductor channel. An alternating stack of insulating layers and spacer material layers is formed over the gate dielectric layer. The spacer material layers are formed as, or are subsequently replaced with, electrically conducive layers. Memory stack structures are formed through the alternating stack and the gate dielectric layer. Electrical charges can be injected into the charge trapping gate dielectric layer from the horizontal semiconductor channel to program the threshold voltage of a select field effect transistor employing a bottommost electrically conductive layer as a select gate electrode. The programmable threshold voltage can be advantageously employed to provide enhanced electrical isolation among word lines.

24 Claims, 23 Drawing Sheets

(51) Int. Cl.
*H01L 21/28* (2006.01)
*H01L 27/1157* (2017.01)

(58) Field of Classification Search
CPC .......... H01L 27/11551; H01L 21/8221; G11C 16/0483
See application file for complete search history.

(56) References Cited

U.S. PATENT DOCUMENTS

| | | |
|---|---|---|
| 7,023,739 B2 | 4/2006 | Chen et al. |
| 7,129,538 B2 | 10/2006 | Lee et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |
| 7,575,973 B2 | 8/2009 | Mokhlesi et al. |
| 7,745,265 B2 | 6/2010 | Mokhlesi et al. |
| 7,764,534 B2 | 7/2010 | Thorp et al. |
| 7,808,038 B2 | 10/2010 | Mokhlesi et al. |
| 7,825,455 B2 | 11/2010 | Lee et al. |
| 7,846,782 B2 | 12/2010 | Maxwell et al. |
| 7,848,145 B2 | 12/2010 | Mokhlesi et al. |
| 7,851,851 B2 | 12/2010 | Mokhlesi et al. |
| 8,008,710 B2 | 8/2011 | Fukuzumi |
| 8,014,185 B2 | 9/2011 | Scheuerlein |
| 8,053,829 B2 | 11/2011 | Kang et al. |
| 8,187,932 B2 | 5/2012 | Nguyen et al. |
| 8,394,716 B2 | 3/2013 | Hwang et al. |
| 8,520,425 B2 | 8/2013 | Xiao et al. |
| 8,557,654 B2 | 10/2013 | Rabkin et al. |
| 9,023,719 B2 | 5/2015 | Pachamuthu et al. |
| 9,230,905 B2 | 1/2016 | Takaki et al. |
| 9,230,974 B1 | 1/2016 | Pachamuthu et al. |
| 9,331,088 B2 | 5/2016 | Takaki |
| 9,343,507 B2 | 5/2016 | Takaki |
| 9,368,509 B2 | 6/2016 | Pang et al. |
| 2003/0062574 A1 | 4/2003 | Hsieh |
| 2007/0210338 A1 | 9/2007 | Orlowski |
| 2007/0252201 A1 | 11/2007 | Kito et al. |
| 2009/0003082 A1 | 1/2009 | Meeks et al. |
| 2009/0230449 A1 | 9/2009 | Sakaguchi et al. |
| 2010/0013049 A1 | 1/2010 | Tanaka et al. |
| 2010/0044778 A1 | 2/2010 | Seol |
| 2010/0112769 A1 | 5/2010 | Son et al. |
| 2010/0120214 A1 | 5/2010 | Park et al. |
| 2010/0155810 A1 | 6/2010 | Kim et al. |
| 2010/0155818 A1 | 6/2010 | Cho |
| 2010/0181610 A1 | 7/2010 | Kim et al. |
| 2010/0207195 A1 | 8/2010 | Fukuzumi et al. |
| 2010/0254191 A1 | 10/2010 | Son et al. |
| 2010/0320528 A1 | 12/2010 | Jeong et al. |
| 2011/0031546 A1 | 2/2011 | Uenaka et al. |
| 2011/0076819 A1 | 3/2011 | Kim et al. |
| 2011/0133606 A1 | 6/2011 | Yoshida et al. |
| 2011/0151667 A1 | 6/2011 | Hwang et al. |
| 2011/0169071 A1 | 7/2011 | Uenaka |
| 2011/0266606 A1 | 11/2011 | Park et al. |
| 2012/0001247 A1 | 1/2012 | Alsmeier |
| 2012/0001249 A1 | 1/2012 | Alsmeier |
| 2012/0001250 A1 | 1/2012 | Alsmeier |
| 2012/0147648 A1 | 6/2012 | Scheuerlein |
| 2013/0043455 A1 | 2/2013 | Bateman |
| 2013/0126957 A1 | 5/2013 | Higashitani et al. |
| 2013/0264631 A1 | 10/2013 | Alsmeier et al. |
| 2013/0313627 A1 | 11/2013 | Lee |
| 2015/0076584 A1 | 3/2015 | Pachamuthu et al. |
| 2015/0179659 A1 | 6/2015 | Takaki |
| 2015/0179660 A1 | 6/2015 | Yada et al. |
| 2015/0263069 A1 | 9/2015 | Jo |
| 2016/0043143 A1 | 2/2016 | Sakotsubo et al. |
| 2016/0049421 A1 | 2/2016 | Zhang et al. |
| 2016/0204122 A1 | 7/2016 | Shoji et al. |

FOREIGN PATENT DOCUMENTS

| | | |
|---|---|---|
| KR | 20110021444 A | 3/2011 |
| WO | WO 02/15277 A2 | 2/2002 |
| WO | WO 2007/004843 A1 | 1/2007 |

OTHER PUBLICATIONS

International Search Report & Written Opinion, PCT/US2011/042566, Jan. 17, 2012 (30 pp.).

Invitation to Pay Additional Fees & Partial International Search Report, PCT/US2011/042566, Sep. 28, 2011. (7 pp.).

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Kimura, Masahide "3D Cells Make Terabit NAND Flash Possible," Nikkei Electronics Asia, Sep. 17, 2009, 6pgs.

Maeda et al., "Multi-Stacked 1G Cell/Layer Pipe-Shaped BiCS Flash Memory," 2009 Symposium on VLSI Technology Digest of Technical Papers, pp. 22-23.

Tanaka et al., "Bit-Cost Scalable Technology for Low-Cost and Ultrahigh-Density Flash Memory," Toshiba Review, vol. 63, No. 2, 2008, pp. 28-31.

Lue, H.T. et al., A Novel Dual-Channel 3D NAND Flash Featuring both N-Channel and P-Channel NAND Characteristics for Bit-alterable Flash Memory and A New Opportunity in Sensing the Stored Charge in the WL Space, IEEE, IEDMI 13-82, pp. 3.7.1-3.7.4, (2013).

Endoh et al., "Novel Ultra High Density Memory with a Stacked-Surrounding Gate Transistor (S-SGT) Structured Cell," IEDM Proc. (2001) 33-36.

International Search Report and Written Opinion of the International Searching Authority for PCT/US2015/051175, dated Mar. 14, 2016, 24 pages.

U.S. Appl. No. 14/491,026, filed Sep. 19, 2014, SanDisk Technologies Inc.

U.S. Appl. No. 14/491,315, filed Sep. 19, 2014, SanDisk Technologies Inc.

U.S. Appl. No. 14/501,539, filed Sep. 30, 2014, SanDisk Technologies Inc.

U.S. Appl. No. 14/540,479, filed Nov. 13, 2014, SanDisk Technologies Inc.

U.S. Appl. No. 14/602,491, filed Jan. 22, 2015, SanDisk Technologies Inc.

U.S. Appl. No. 14/703,367, filed May 4, 2015, SanDisk Technologies Inc.

U.S. Appl. No. 14/707,459, filed May 8, 2015, SanDisk, Technologies Inc.

U.S. Appl. No. 14/851,296, filed Sep. 11, 2015, SanDisk 3D LLC.

U.S. Appl. No. 14/867,351, filed Sep. 28, 2015, SanDisk Technologies Inc.

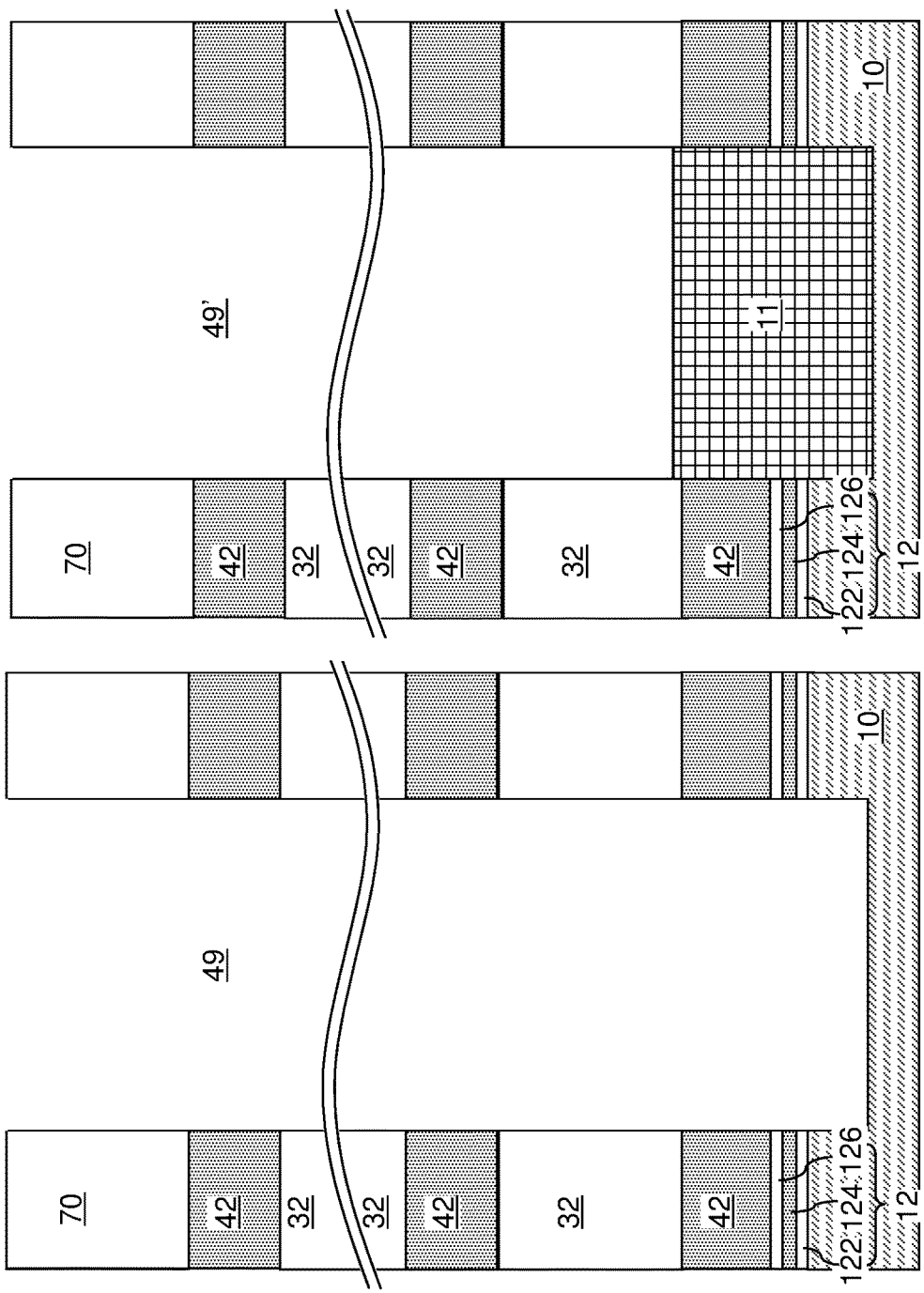

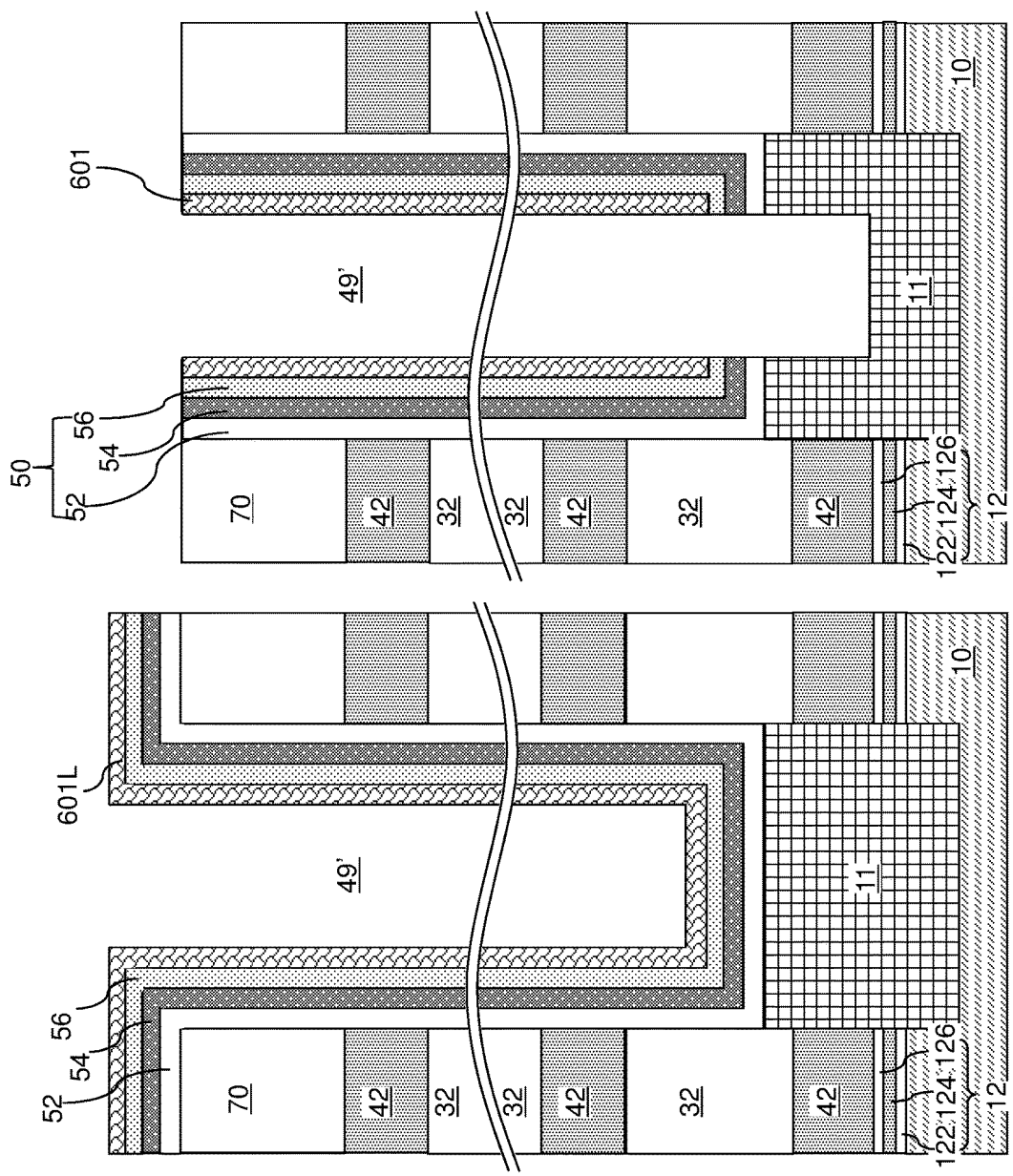

US 9,748,266 B1

THREE-DIMENSIONAL MEMORY DEVICE WITH SELECT TRANSISTOR HAVING CHARGE TRAPPING GATE DIELECTRIC LAYER AND METHODS OF MAKING AND OPERATING THEREOF

FIELD

The present disclosure relates generally to the field of semiconductor devices and specifically to a three-dimensional memory device including a select transistor having a charge trapping gate dielectric layer and a method of forming and operating the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises an alternating stack of insulating layers and electrically conductive layers located over a substrate, wherein a bottommost electrically conductive layer comprises a select gate electrode of a select field effect transistor of the memory device, memory stack structures extending through the alternating stack, each of the memory stack structures comprising a memory film and a vertical semiconductor channel, a horizontal semiconductor channel of the select field effect transistor underlying the select gate electrode, and a gate dielectric layer contacting the top surface of the horizontal semiconductor channel, and comprising from bottom to top, a tunneling gate dielectric layer, a charge trapping gate dielectric layer, and a cap gate dielectric layer.

According to another aspect of the present disclosure, a method of forming a three-dimensional memory device is provided. A substrate including a semiconductor material layer in an upper portion thereof is provided. A gate dielectric layer is formed directly on a top surface of the semiconductor material layer. The gate dielectric layer includes, from bottom to top, a tunneling gate dielectric layer, a charge trapping gate dielectric layer, and a cap gate dielectric layer. An alternating stack of insulating layers and spacer material layers is formed over the gate dielectric layer. Memory stack structures are formed through the alternating stack. The spacer material layers are formed as, or subsequently replaced with, electrically conductive layers. An upper portion of the semiconductor material layer comprises a horizontal semiconductor channel for a field effect transistor. A bottommost electrically conductive layer provided upon formation of the electrically conductive layers within the alternating stack comprises a select gate electrode for the field effect transistor.

BRIEF DESCRIPTION OF THE DRAWINGS

FIGS. 5A-5H are sequential schematic vertical cross-sectional views of a memory opening within the first exemplary structure during various processing steps employed to form a memory stack structure according to an embodiment of the present disclosure.

DETAILED DESCRIPTION

Figure 1:
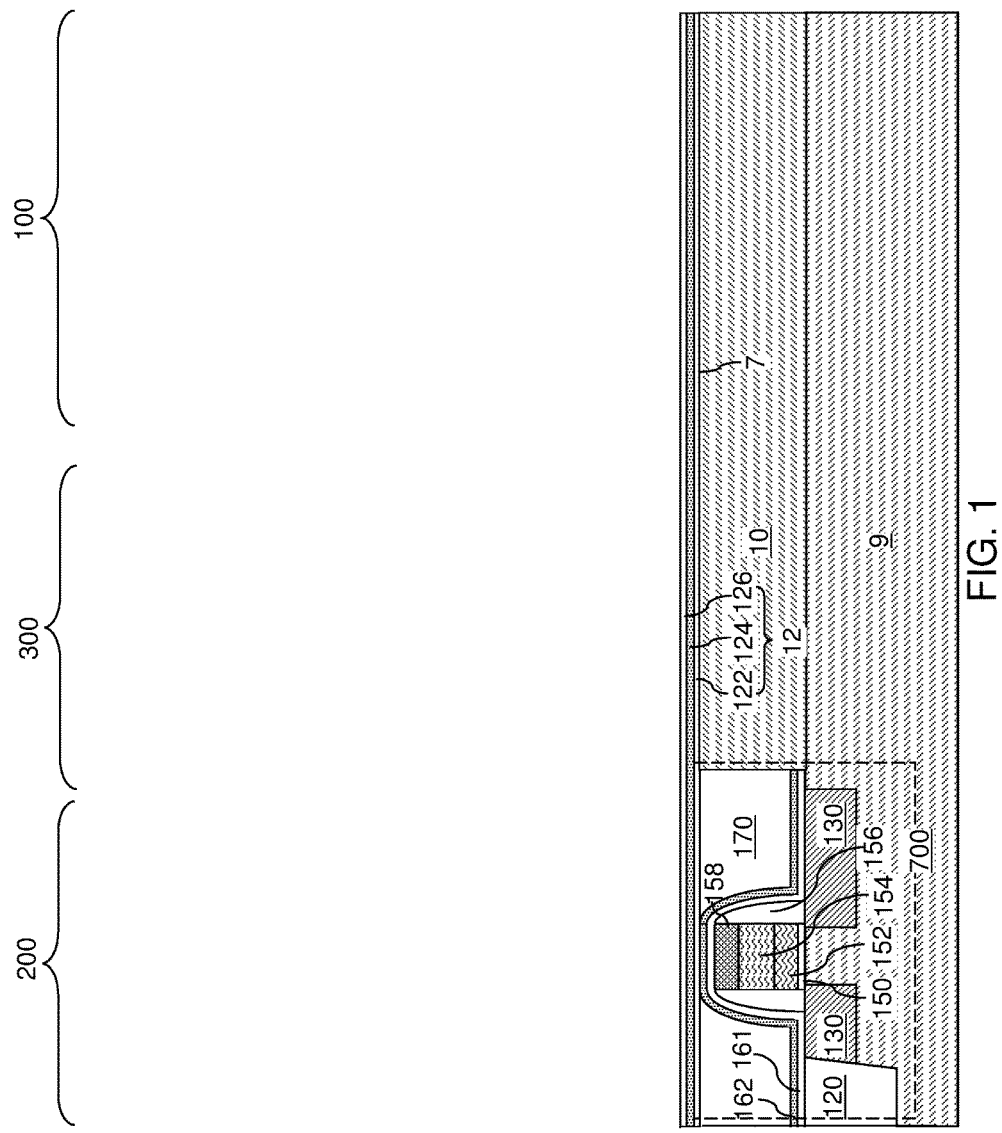
FIG. 1 is a schematic vertical cross-sectional view of a first exemplary structure after formation of at least one peripheral device and a gate dielectric layer according to an embodiment of the present disclosure.

As discussed above, the present disclosure is directed a three-dimensional memory device including select transistor having a charge trapping gate dielectric layer located between its channel and gate electrode, and a method of forming and operating the same, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to an embodiment of the present disclosure is illustrated, which can be employed, for example, to fabricate a device structure containing vertical NAND memory devices. The first exemplary structure includes a substrate, which can be a semiconductor substrate (9, 10). The substrate can include a substrate semiconductor layer 9. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0 \times 10^{-6}$ S/cm to $1.0 \times 10^{5}$ S/cm, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulating material" or a "dielectric material" refers to a material having electrical conductivity less than $1.0 \times 10^{-6}$ S/cm. All measurements for electrical conductivities are made at the standard condition. Optionally, at least one doped well (e.g., a p-type well, not expressly shown) can be formed within the substrate semiconductor layer 9 and/or the semiconductor material layer 10 located over the substrate semiconductor layer 9.

At least one semiconductor device 700 for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric 158. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a dielectric liner. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material (e.g., single crystal silicon), for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 170 can be removed, for example, by chemical mechanical planarization (CMP). In this case, the semiconductor material layer 10 can have a top surface that is coplanar with the top surface of the planarization dielectric layer 170.

The substrate semiconductor layer 9 and the semiconductor material layer 10 can collectively constitute a substrate (9, 10). The substrate (9, 10) can have a major surface 7, which can be, for example, a topmost surface of the semiconductor material layer 10. The major surface 7 can be a semiconductor surface. In one embodiment, the major surface 7 can be a single crystalline semiconductor surface, such as a single crystalline silicon surface.

The region (i.e., area) of the at least one semiconductor device 700 is herein referred to as a peripheral device region 200. The region in which a memory array is subsequently formed is herein referred to as a memory array region 100. A contact region 300 for subsequently forming stepped terraces of electrically conductive layers can be provided between the memory array region 100 and the peripheral device region 200.

A gate dielectric layer 12 can be formed directly on the top surface of the semiconductor material layer 10 and optionally over the planarization dielectric layer 170. The gate dielectric layer 12 can include a layer stack that can trap electrical charge carriers, which can be electrons or holes. In one embodiment, the gate dielectric layer 12 can include, from bottom to top, a tunneling gate dielectric layer 122, a charge trapping gate dielectric layer 124, and a cap gate dielectric layer 126. The tunneling gate dielectric layer 122, the charge trapping gate dielectric layer 124, and the cap gate dielectric layer 126 can be deposited employing a sequence of deposition steps. The cap gate dielectric layer 126 is part of a blocking dielectric of a select transistor of a three dimensional NAND memory device as well be described below.

The tunneling gate dielectric layer 122 can include at least one dielectric material selected from silicon oxide and silicon oxynitride. In one embodiment, the tunneling gate dielectric layer 122 can consist of a silicon oxide layer. In another embodiment, the tunneling gate dielectric layer 122 can consist of a silicon oxynitride layer. In yet another embodiment, the tunneling gate dielectric layer 122 can consist of a stack of a silicon oxide layer and a silicon oxynitride layer. The silicon oxide layer may be located at the bottom of the stack, or the silicon oxynitride layer may be located at the bottom of the stack. In still another embodiment, the tunneling gate dielectric layer 122 can include a stack of a first silicon oxide layer, a silicon oxynitride layer, and a second silicon oxide layer. As used herein, a silicon oxynitride layer refers to a layer of a material having a composition of $SiO_{2(1-\delta)}N_{4\delta/3}$, in which $\delta$ is in a range between 0 and 0.9. The thickness of the tunneling gate dielectric layer 122 can be in a range from 1 nm to 3 nm, although lesser and greater thicknesses can also be employed. Each component layer of the tunneling gate dielectric layer 122 can be deposited by chemical vapor deposition or atomic layer deposition. Conformal and/or non-conformal deposition methods can be employed to deposit the tunneling gate dielectric layer 122, which is a planar material layer having a uniform thickness throughout. In case the tunneling gate dielectric layer 122 includes a plurality of component layers, each component layer can have a uniform thickness throughout.

The charge trapping gate dielectric layer 124 includes a charge trapping material such as silicon nitride. In one embodiment, the charge trapping gate dielectric layer 124 can consist essentially of silicon nitride. The charge trapping gate dielectric layer 124 can be deposited by a conformal or non-conformal deposition process. For example, the charge trapping gate dielectric layer 124 can be deposited by low pressure chemical vapor deposition (LPCVD). The thickness of the charge trapping gate dielectric layer 124 can be in a range from 1 nm to 4 nm, although lesser and greater thicknesses can also be employed.

The cap gate dielectric layer 126 includes a dielectric material that can block tunneling of charge carriers from the opposite side of the tunneling gate dielectric layer 122. The cap gate dielectric layer 126 can include a dielectric material such as silicon oxide, silicon oxynitride, a dielectric metal oxide (such as aluminum oxide), or a combination thereof. In one embodiment, the cap gate dielectric layer 126 can consist of a silicon oxide layer. In another embodiment, the cap gate dielectric layer 126 can include a stack of a silicon oxide layer and a dielectric metal oxide layer. The thickness of the cap gate dielectric layer 126 can be greater than the thickness of the tunneling gate dielectric layer 122. For example, the thickness of the cap gate dielectric layer 126 can be in a range from 1 nm to 6 nm, although lesser and greater thicknesses can also be employed.

In one embodiment, the gate tunneling dielectric layer 122 can be a silicon oxide layer, the charge trapping gate dielectric layer 124 can be a silicon nitride layer, and the cap gate dielectric layer can be a silicon oxide layer. In this case, the gate dielectric layer 12 can include a stack of a silicon oxide layer, a silicon nitride layer, and a silicon oxide layer. The thickness of the gate dielectric layer 12 can be in a range from 3 nm to 13 nm, although lesser and greater thicknesses can also be employed.

Figure 2:
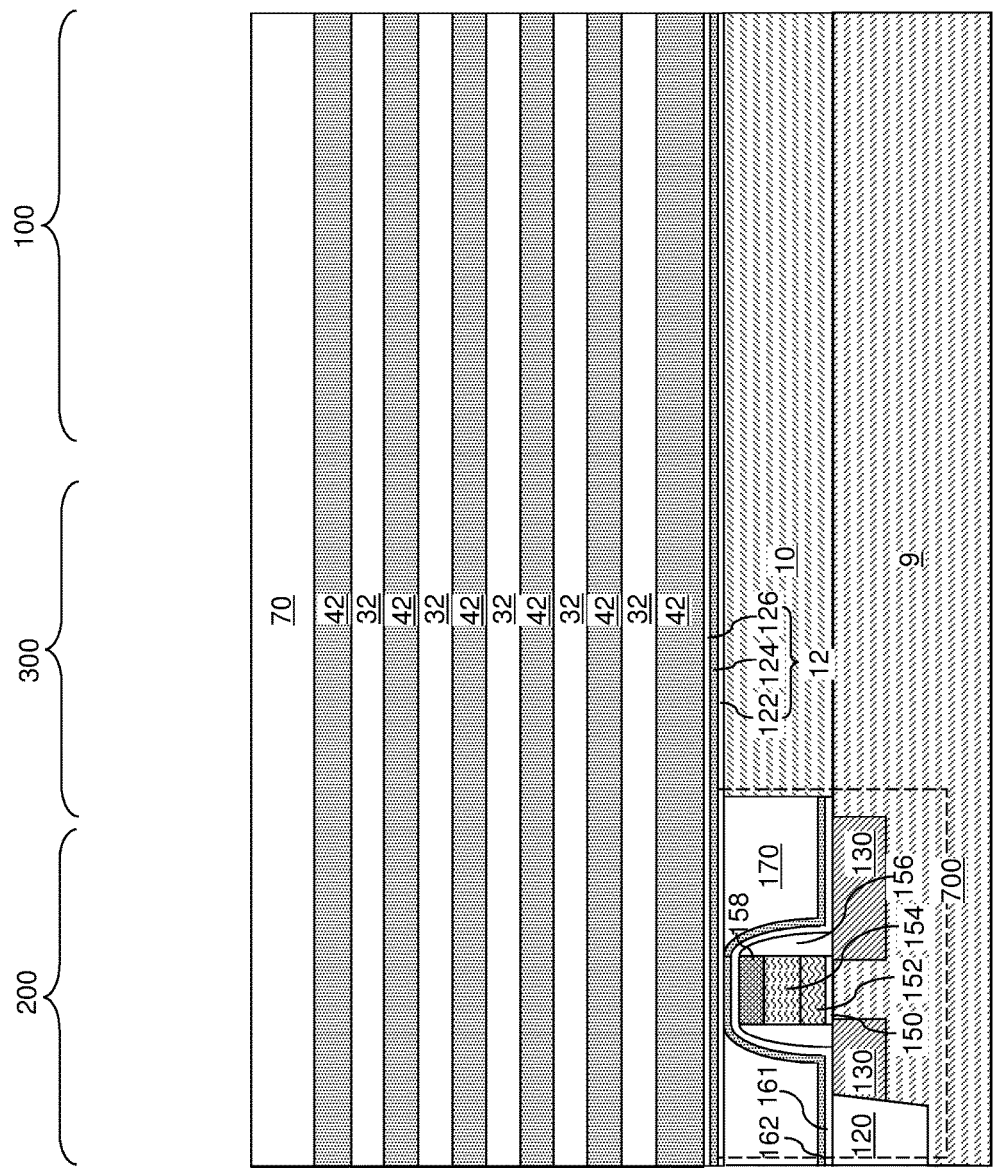
FIG. 2 is a schematic vertical cross-sectional view of the first exemplary structure after formation of an alternating stack of insulating layers and spacer material layers according to an embodiment of the present disclosure.

Referring to FIG. 2, a stack of an alternating plurality of first material layers (which can be insulating layers 32) and second material layers (which can be sacrificial material layer 42) is formed over the top surface of the substrate, which can be, for example, on the top surface of the gate dielectric layer 12. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, by CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
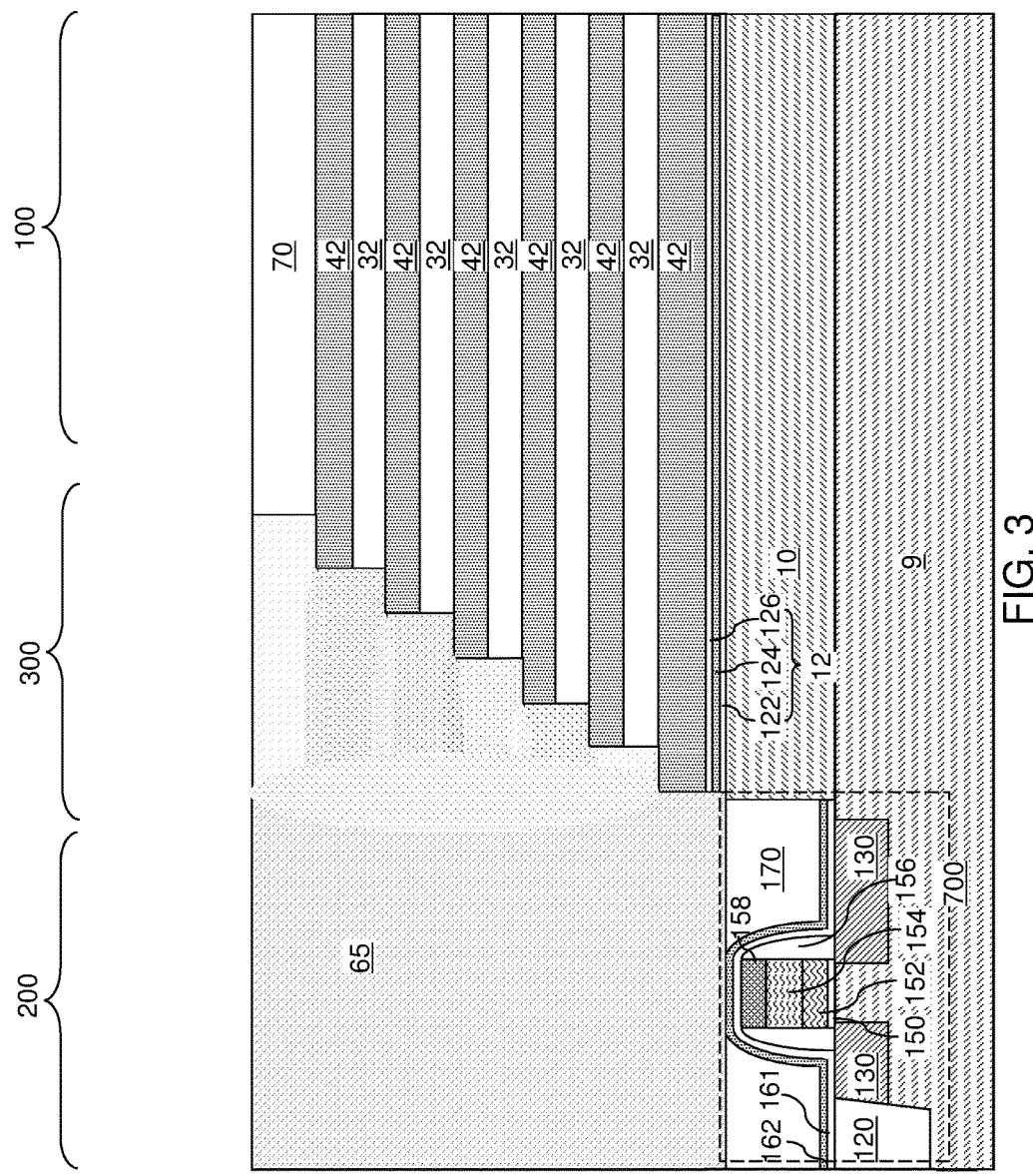
FIG. 3 is a schematic vertical cross-sectional view of the first exemplary structure after formation of a terrace region on the alternating stack and a retro-stepped dielectric material portion according to an embodiment of the present disclosure.

Referring to FIG. 3, a stepped cavity can be formed within the contact region 300. As used herein, a "stepped cavity" refers to a cavity including stepped surfaces that include a continuous set of surfaces including vertical surface and horizontal surfaces that are adjoined to provide different lateral extents. In one embodiment, an upper region of the stepped cavity can have a greater lateral extent than a lower region of the stepped cavity. In one embodiment, each overlying portion of the stepped cavity can have a greater lateral extent than any underlying portion of the stepped cavity.

Specifically, the alternating stack (32, 42) can be patterned to form a stepped cavity in the contact region 300. The stepped cavity includes stepped terraces, which are a set of stepped surfaces that continuously extend from the bottommost layer of the alternating stack (32, 42) to the topmost layer of the alternating stack (32, 42). Within the terrace region, each spacer material layer (i.e., each sacrificial material layer 42) other than a topmost spacer material layer within the alternating stack (32, 42) laterally extends farther than any overlying spacer material layers within the alternating stack (32, 42). Thus, the topmost sacrificial material layer 42 can have the least lateral extent along a horizontal direction, the second-from-the-top sacrificial material layer 42 can have a greater lateral extent along the horizontal direction, the third-from-the-top sacrificial material layer can have a greater lateral extent than the topmost sacrificial material layer 42 and the second-from-the-top sacrificial material layer 42, and so on. In one embodiment, a sidewall of the gate dielectric layer 12 and a top surface of the planarization dielectric layer 170 can be physically exposed to the stepped cavity.

In one embodiment, the horizontal cross-sectional shape of the stepped cavity changes in steps as a function of the vertical distance from the top surface of the substrate (9, 10). In one embodiment, the stepped cavity can be formed applying and initially patterning a trimmable masking material layer, and by repetitively performing a set of processing steps. The set of processing steps can include, for example, an etch process of a first type (such as an anisotropic reactive ion etch) that vertically increases the depth of a cavity by one or more levels, and an etch process of a second type (referred to as a trimming process) that laterally expands the area to be vertically etched in a subsequent etch process of the first type. As used herein, a "level" of a structure including alternating plurality is defined as the relative position of a pair of a first material layer and a second material layer within the structure.

A retro-stepped dielectric material portion 65 can be formed in the stepped cavity by deposition of a dielectric material therein. The retro-stepped dielectric material portion 65 includes a dielectric fill material such as silicon oxide. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F. The retro-stepped dielectric material portion 65 contacts the stepped surfaces of the alternating stack (32, 42). The retro-stepped dielectric material portion 65 can contact the sidewalls of the cap gate dielectric layer 126, the charge trapping gate dielectric layer 124, and the tunneling gate dielectric layer 122.

Figure 4:
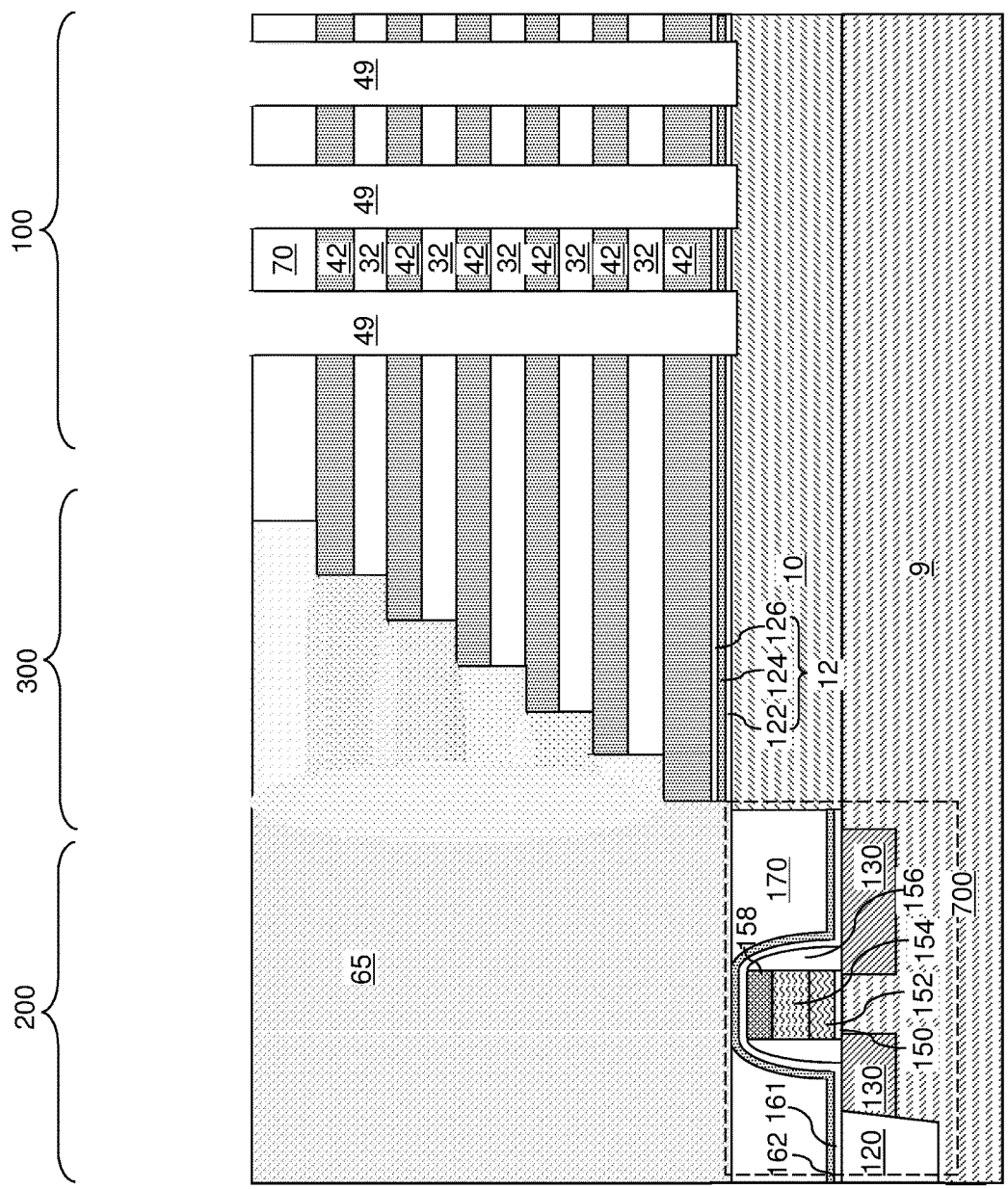
FIG. 4 is a schematic vertical cross-sectional view of the first exemplary structure after formation of memory openings according to an embodiment of the present disclosure.

Referring to FIG. 4, a lithographic material stack (not shown) including at least a photoresist layer can be formed over the insulating cap layer 70 and the retro-stepped dielectric material portion 65, and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 can be substantially vertical, or can be tapered. The patterned lithographic material stack can be subsequently removed, for example, by ashing.

The memory openings 49 are formed through the gate dielectric layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The array of memory openings 49 is formed in the memory array region 100. In one embodiment, the substrate semiconductor layer 9 and the semiconductor material layer 10 collectively constitutes a substrate (9, 10), which can be a semiconductor substrate. In another embodiment, the semiconductor material layer 10 may be omitted, and the memory openings 49 can be extend to a top surface of the substrate semiconductor layer 9.

Referring to FIG. 5A, a memory opening 49 in the exemplary device structure of FIG. 4 is illustrated. The memory opening 49 extends through the insulating cap layer 70, the alternating stack (32, 42), and the gate dielectric layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional epitaxial channel portion (e.g., an epitaxial pedestal) 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer. The epitaxial channel portion 11 contacts sidewalls of the cap gate dielectric layer 126, the charge trapping gate dielectric layer 124, and the tunneling gate dielectric layer 122.

The epitaxial channel portion 11 can be a portion of a transistor channel that extends between a source region to be subsequently formed in the substrate (9, 10) and a drain region to be subsequently formed in an upper portion of the memory opening 49. A cavity 49' is present in the unfilled portion of the memory opening 49 above the epitaxial channel portion 11. In one embodiment, the epitaxial channel portion 11 can comprise single crystalline silicon. In one embodiment, the epitaxial channel portion 11 can have a doping of the first conductivity type, which is the same as the conductivity type of the semiconductor material layer 10 that the epitaxial channel portion contacts. If a semiconductor material layer 10 is not present, the epitaxial channel portion 11 can be formed directly on the substrate semiconductor layer 9, which can have a doping of the first conductivity type.

Referring to FIG. 5C, a stack of layers including a blocking dielectric layer 52, a memory material layer 54, a tunneling dielectric layer 56, and an optional first semiconductor channel layer 601L can be sequentially deposited in the memory openings 49. In one embodiment, the blocking dielectric layer 52 can include a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The blocking dielectric layer 52 can be deposited, for example, by chemical vapor deposition (CVD), atomic layer deposition (ALD), pulsed laser deposition (PLD), liquid source misted chemical deposition, or a combination thereof. In one embodiment, the blocking dielectric layer 52 includes aluminum oxide.

Alternatively or additionally, the blocking dielectric layer 52 can include a dielectric material that is different from the dielectric material of the blocking dielectric layer 52. For example, the blocking dielectric layer 52 can include silicon oxide, silicon oxynitride, silicon nitride, or a combination thereof. In one embodiment, the blocking dielectric layer 52 can include a stack including an aluminum oxide layer and a silicon oxide layer. The blocking dielectric layer 52 can be formed by a conformal deposition method such as low pressure chemical vapor deposition, atomic layer deposition, or a combination thereof. The thickness of the blocking dielectric layer 52 can be in a range from 1 nm to 20 nm, although lesser and greater thicknesses can also be employed. The blocking dielectric layer 52 can subsequently function as a dielectric material portion that blocks leakage of stored electrical charges to control gate electrodes. Alternatively, the blocking dielectric layer 52 can be omitted, and a blocking dielectric layer can be formed after formation of backside recesses on surfaces of memory films to be subsequently formed.

Subsequently, the memory material layer 54 can be formed. In one embodiment, the memory material layer 54 can be a continuous layer or patterned discrete portions of a charge trapping material including a dielectric charge trapping material, which can be, for example, silicon nitride. Alternatively, the memory material layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the memory material layer 54 includes a silicon nitride layer. In one embodiment, the sacrificial material layers 42 and the insulating layers 32 can have vertically coincident sidewalls, and the memory material layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the memory material layer 54 as a plurality of memory material portions that are vertically spaced apart. While the present disclosure is described employing an embodiment in which the memory material layer 54 is a single continuous layer, embodiments are expressly contemplated herein in which the memory material layer 54 is replaced with a plurality of memory material portions (which can be charge trapping material portions or electrically isolated conductive material portions) that are vertically spaced apart.

The memory material layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 54 may comprise an insulating charge trapping material, such as one or more silicon nitride segments. Alternatively, the memory material layer 54 may comprise conductive nanoparticles such as metal nanoparticles, which can be, for example, ruthenium nanoparticles. The memory material layer 54 can be formed, for example, by chemical vapor deposition (CVD), atomic layer deposition (ALD), physical vapor deposition (PVD), or any suitable deposition technique for storing electrical charges therein. The thickness of the memory material layer 54 can be in a range from 2 nm to 20 nm, although lesser and greater thicknesses can also be employed.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (52, 54, 56, 601L).

Referring to FIG. 5D, the optional first semiconductor channel layer 601L, the tunneling dielectric layer 56L, the memory material layer 54, the blocking dielectric layer 52 are sequentially anisotropically etched employing at least one anisotropic etch process. The portions of the first semiconductor channel layer 601, the tunneling dielectric layer 56, the memory material layer 54, and the blocking dielectric layer 52 located above the top surface of the insulating cap layer 70 can be removed by the at least one anisotropic etch process. Further, the horizontal portions of the first semiconductor channel layer 601L, the tunneling dielectric layer 56, the memory material layer 54, and the blocking dielectric layer 52 at a bottom of each cavity 49' can be removed to form openings in remaining portions thereof. Each of the first semiconductor channel layer 601L, the tunneling dielectric layer 56, the memory material layer 54, and the blocking dielectric layer 52 can be etched by anisotropic etch process.

Each remaining portion of the first semiconductor channel layer 601L constitutes a first semiconductor channel portion 601. The memory material layer 54 can comprise a charge trapping material or a floating gate material. In one embodiment, each memory material layer 54 can include a vertical stack of charge storage regions that store electrical charges upon programming. In one embodiment, the memory material layer 54 can be a charge storage layer in which each portion adjacent to the sacrificial material layers 42 constitutes a charge storage region.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric layer 56, the memory material layer 54, and the blocking dielectric layer 52. Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric layer 56 is located over the memory material layer 54. A set of blocking dielectric layer 52, a memory material layer 54, and a tunneling dielectric layer 56 in a memory opening 49 constitutes a memory film 50, which includes a plurality of charge storage regions (as embodied as the memory material layer 54) that are insulated from surrounding materials by the blocking dielectric layer 52 and the tunneling dielectric layer 56. In one embodiment, the first semiconductor channel portion 601, the tunneling dielectric layer 56, the memory material layer 54, the blocking dielectric layer 52, and the blocking dielectric layer 52 can have vertically coincident sidewalls.

Figure 5F:
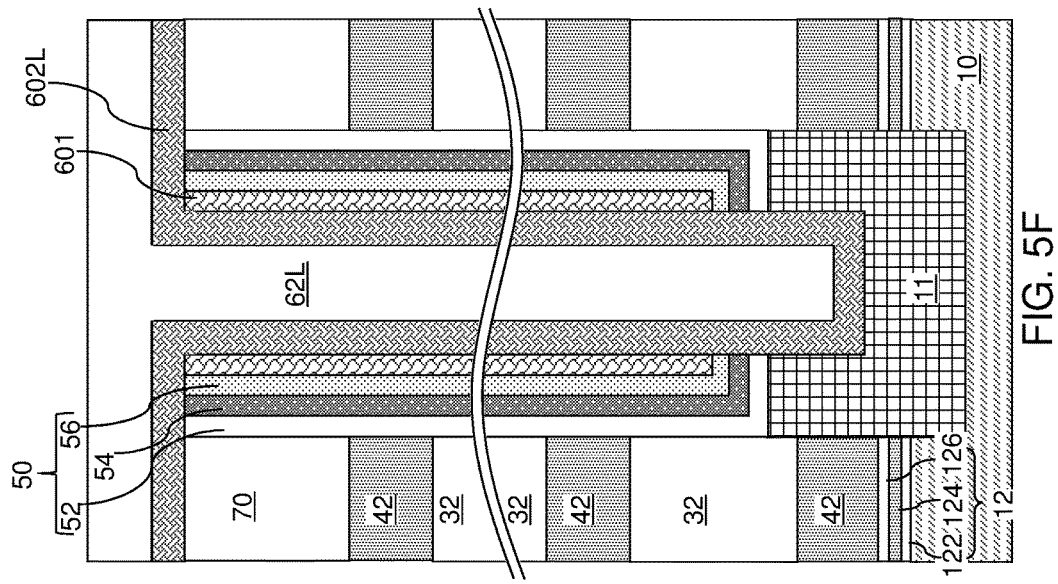
Figure 5E:
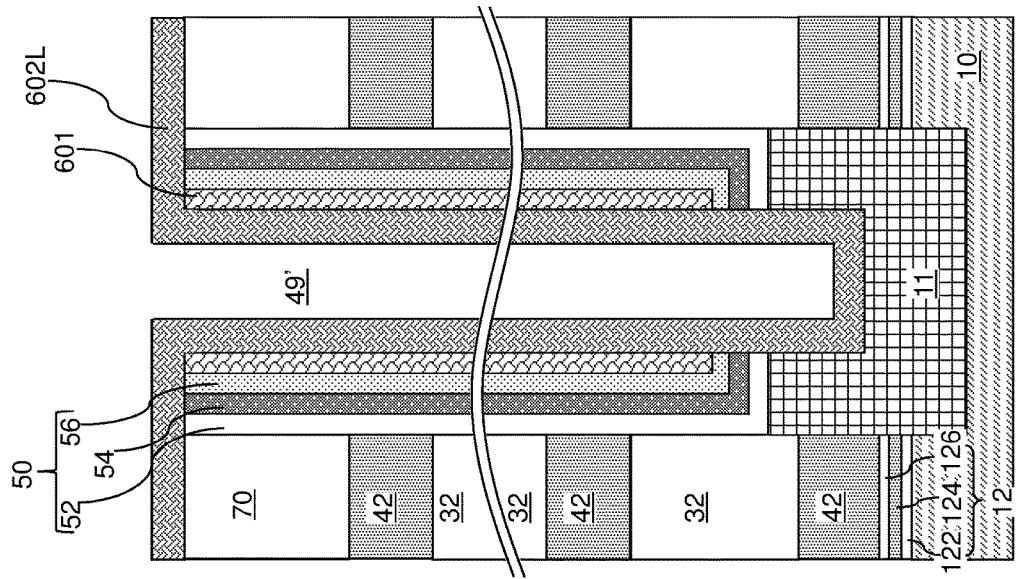

Referring to FIG. 5E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 5F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 5G:
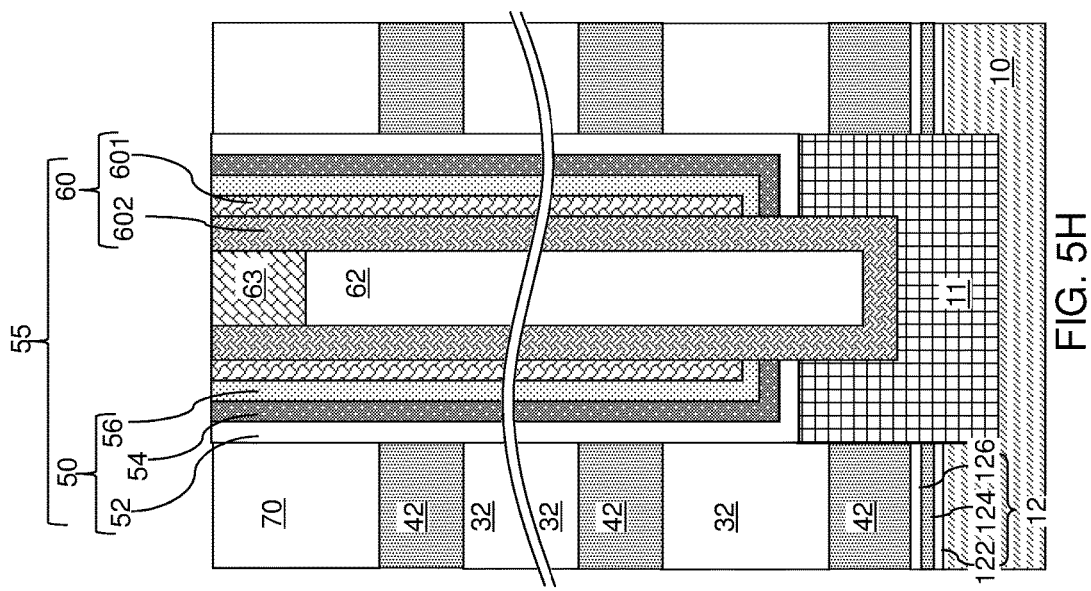

Referring to FIG. 5G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a vertical semiconductor channel 60 through which electrical current can flow when a vertical NAND device including the vertical semiconductor channel 60 is turned on. A tunneling dielectric layer 56 is surrounded by a memory material layer 54, and laterally surrounds a portion of the vertical semiconductor channel 60. Each adjoining set of a blocking dielectric layer 52, a memory material layer 54, and a tunneling dielectric layer 56 collectively constitute a memory film 50, which can store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Figure 5H:
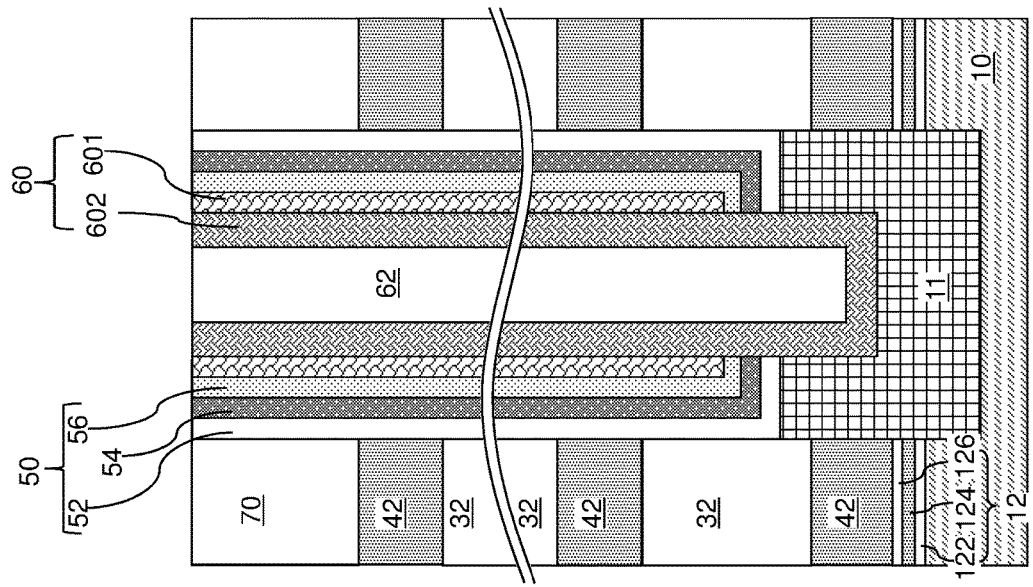

Referring to FIG. 5H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Each adjoining set of a vertical semiconductor channel 60 and a memory film 50 constitutes a memory stack structure 55, which includes a vertical stack of memory elements that can be embodied as portions of the memory material layer 54 located at the levels of the sacrificial material layers 42. An epitaxial channel portion 11 can be provided at a bottom of each memory opening 49. Each memory stack structure 55 can be provided over a respective epitaxial channel portion 11.

The various layers in each memory film 50 are formed after formation of the gate dielectric layer 12. As such, the memory films 50 can include a different layer stack than the gate dielectric layer 12. As used herein, a first layer stack and a second layer stack are the same if the first and second layer stacks have an identical sequence of component layers from one end to another, and component layer in one layer stack has the same composition as, and the same thickness as, the corresponding component layer in the other layer stack. A first layer stack is a different layer stack than the second layer stack if the first layer stack and the second layer stack are not the same. Thus, a memory film 50 and the gate dielectric layer 12 can differ from each other by the sequence of material stacks, by composition between any pair of corresponding component layers, and/or by the thickness between any pair of corresponding component layers.

In one embodiment, the memory film 50 comprises a stack, from outside to inside, of a blocking dielectric layer 52, a memory material layer 54, and a tunneling dielectric layer 56 that differs from the tunneling gate dielectric layer 122 by at least one of composition and thickness. In one embodiment, the memory material layer 54 differs from the charge trapping gate dielectric layer 124 by at least one of composition and thickness. In one embodiment, the blocking dielectric layer 52 differs from the cap gate dielectric layer 126 by at least one of composition and thickness.

Figure 6:
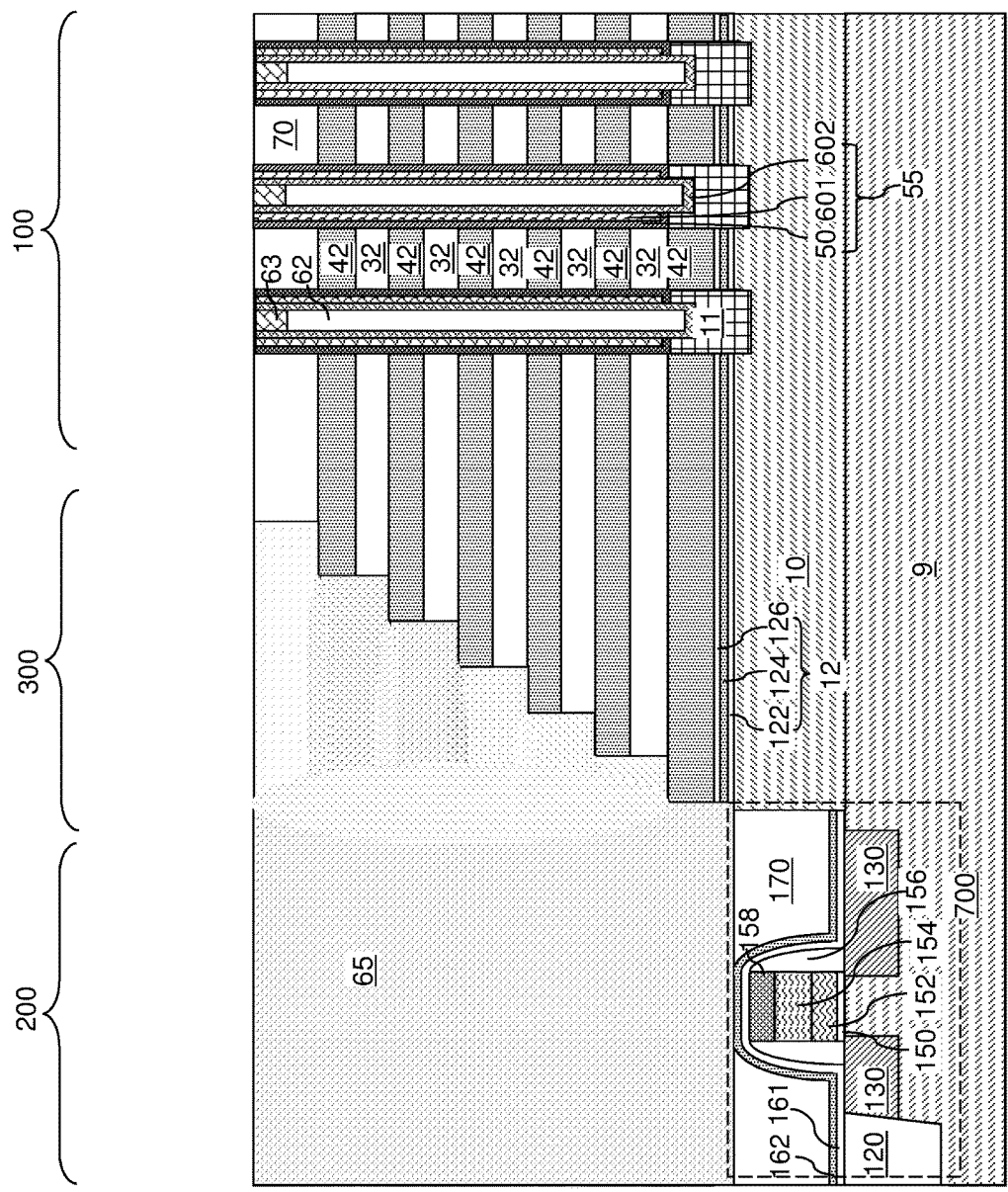
FIG. 6 is a schematic vertical cross-sectional view of the first exemplary structure after formation of memory stack structures according to an embodiment of the present disclosure.

The exemplary memory stack structure 55 can be embedded into the first exemplary structure illustrated in FIG. 4. FIG. 6 illustrates the first exemplary structure that incorporates multiple instances of the exemplary memory stack structure of FIG. 5H. Each exemplary memory stack structure 55 includes a vertical semiconductor channel 60 and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as portions of a memory material layer 54) and an optional blocking dielectric layer 52. The first exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor material layer 10), and a memory opening extending through the stack (32, 42). While the present disclosure is described employing the illustrated configuration for the memory stack structure, the methods of the present disclosure can be applied to alternative memory stack structures including a polycrystalline semiconductor channel.

Figure 7A:
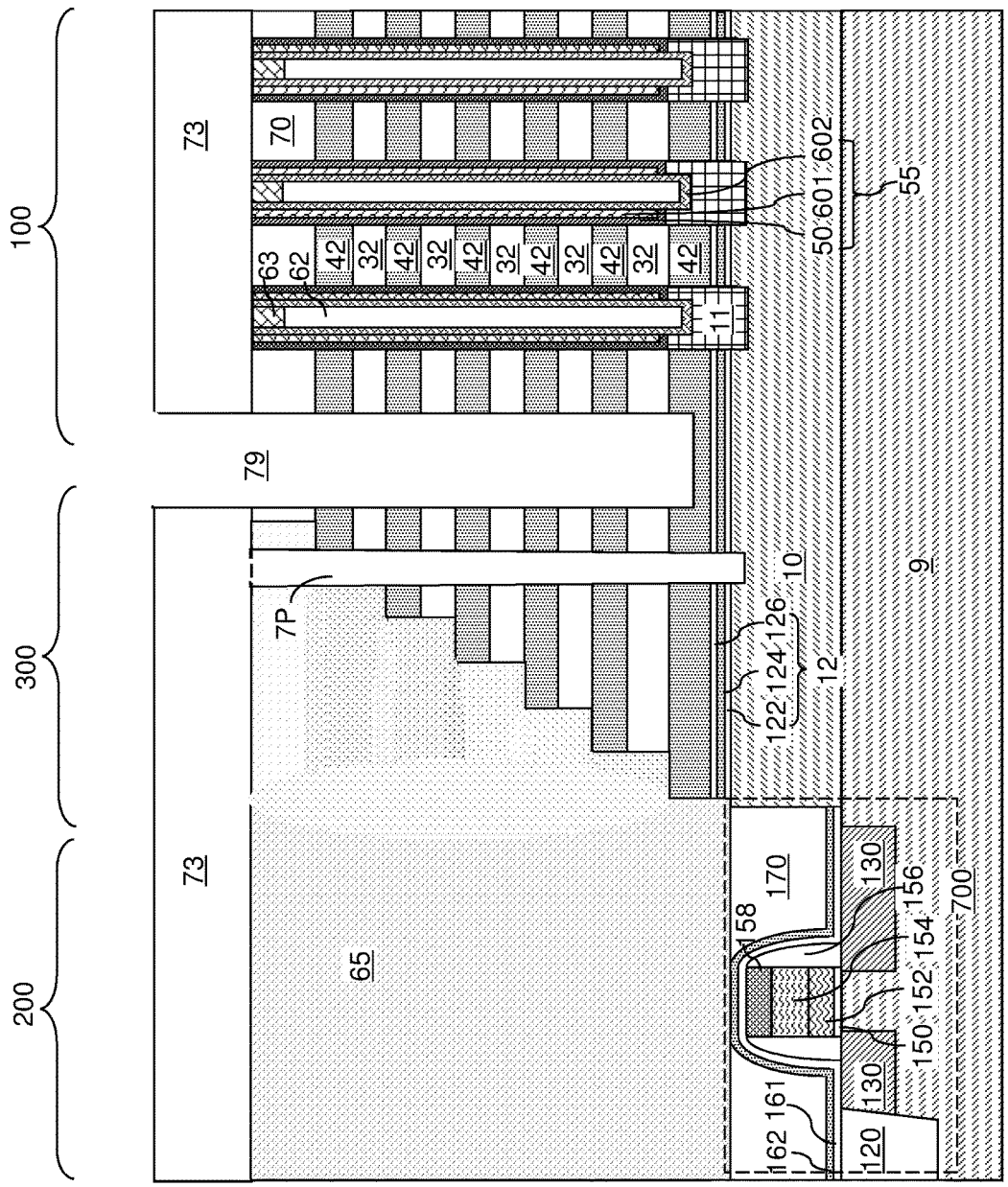
FIG. 7A is a schematic vertical cross-sectional view of the first exemplary structure after formation of a backside contact trench according to an embodiment of the present disclosure.
Figure 7B:
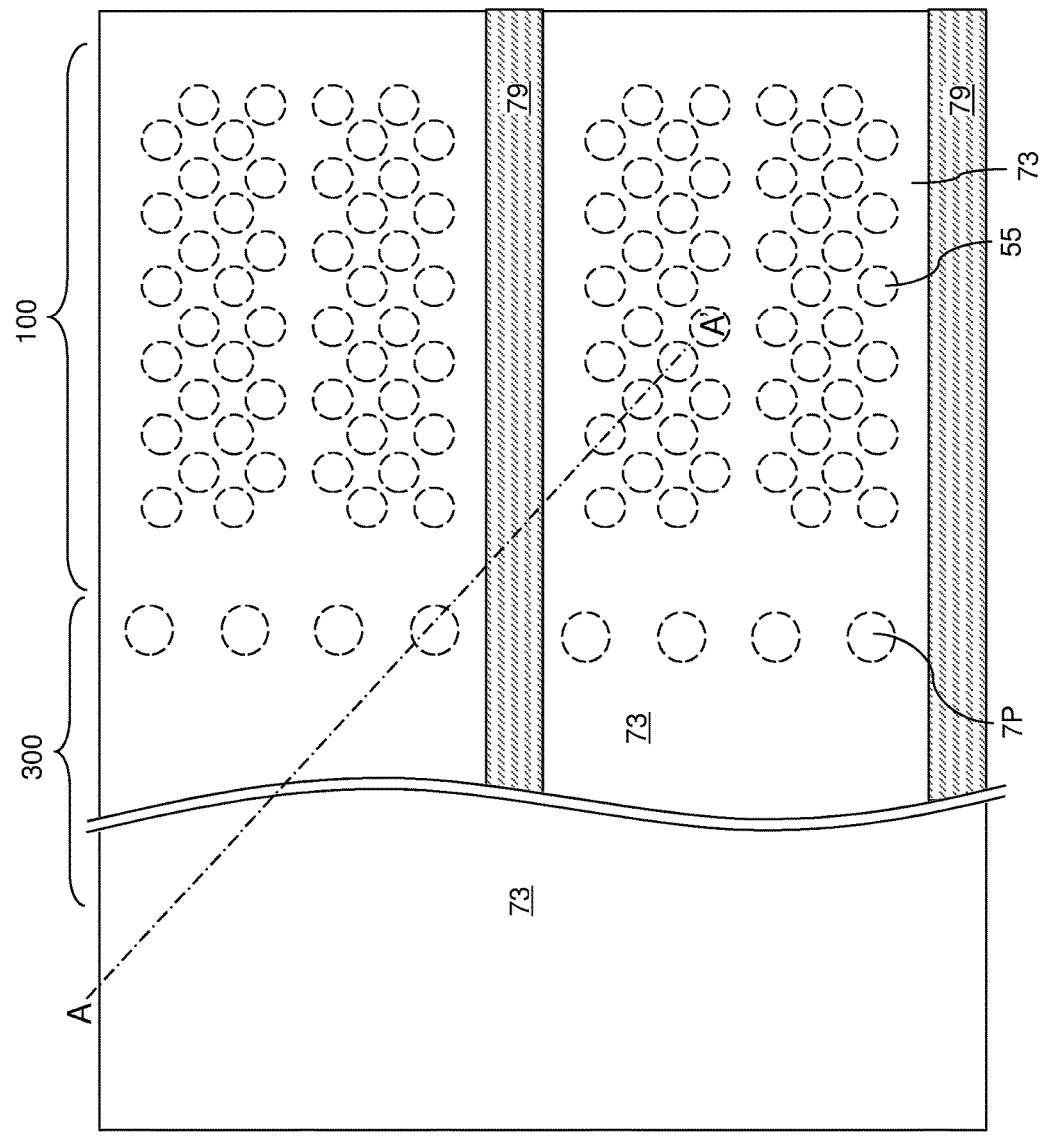
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, at least one support pillar 7P may be optionally formed through the retro-stepped dielectric material portion 65 and/or through the insulating cap layer 70 and/or through the alternating stack (32, 42). The plane A-A' in FIG. 7B corresponds to the plane of the schematic vertical cross-sectional view of FIG. 7A. In one embodiment, the at least one support pillar 7P can be formed in the contact region 300, which is located adjacent to the memory array region 100. The at least one support pillar 7P can be formed, for example, by forming an opening extending through the retro-stepped dielectric material portion 65 and/or through the alternating stack (32, 42) and at least to the top surface of the substrate (9, 10), and by filling the opening either with the memory film and semiconductor channel material or with a dielectric material that is resistant to the etch chemistry to be employed to remove the sacrificial material layers 42.

In one embodiment, the at least one support pillar 7P comprises a dummy memory stack structure which contains the memory film 50, semiconductor channel 60 and core dielectric 62 which are formed at the same time as the memory stack structures 55. However, the dummy memory stack structures 7P are not electrically connected to bit lines and are used as support pillars rather than as NAND strings. In another embodiment, the at least one support pillar 7P can include an insulating material, such as silicon oxide and/or a dielectric metal oxide such as aluminum oxide. In one embodiment, the portion of the dielectric material that is deposited over the insulating cap layer 70 concurrently with deposition of the at least one support pillar 7P can be present over the insulating cap layer 70 as a contact level dielectric layer 73. Each of the at least one support pillar 7P and the contact level dielectric layer 73 is an optional structure. As such, the contact level dielectric layer 73 may, or may not, be present over the insulating cap layer 70 and the retro-stepped dielectric material portion 65. Alternatively, formation of the contact level dielectric layer 73 may be omitted, and at least one via level dielectric layer may be subsequently formed, i.e., after formation of a backside contact via structure.

The contact level dielectric layer 73 and the at least one support pillar 7P can be formed as a single continuous structure of integral construction, i.e., without any material interface therebetween. In another embodiment, the portion of the dielectric material that is deposited over the insulating cap layer 70 concurrently with deposition of the at least one support pillar 7P can be removed, for example, by chemical mechanical planarization or a recess etch. In this case, the contact level dielectric layer 73 is not present, and the top surface of the insulating cap layer 70 can be physically exposed.

A photoresist layer (not shown) can be applied over the alternating stack (32, 42), and is lithographically patterned to form at least one elongated opening in each area in which formation of a backside contact via structure is desired. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

The depth of the at least one backside contact trench 79 can be selected such that the bottom surface of each backside contact trench 79 terminates on a surface of the bottommost sacrificial material layer 42 within the alternating stack (32, 42). In one embodiment, the etch process that forms the at least one backside contact trench 79 can terminate upon detection of physical exposure of the bottommost sacrificial material layer 42. In this case, the etch process can terminate immediately so that the bottom surface of the at least one backside contact trench 79 is flush with the top surface of the bottommost sacrificial material layer 42. Alternatively, an overetch step (such as a timed etch step) can be employed so that the bottom surface of the at least one backside contact trench 79 is located between a first horizontal plane including the top surface of the bottommost sacrificial material layer 42 and a second horizontal plane including the bottom surface of the sacrificial material layer 42.

Terminating the etch process before physically exposing the charge trapping gate dielectric layer 124 is advantageous when the sacrificial material layers and the charge trapping gate dielectric layer 124 include the same dielectric material such as silicon nitride. By preventing physical exposure of the charge trapping gate dielectric layer 124 after formation of the at least one backside contact trench, the charge trapping gate dielectric layer 124 is protected from an isotropic etch process that is subsequently employed to remove the sacrificial material layers 42 to form lateral recesses. If the etch process that forms the at least one backside contact trench 79 terminates before the bottom surface of each backside contact trench 79 reaches the cap gate dielectric layer 126, the cap gate dielectric layer 126 protects the charge trapping gate dielectric layer 124 during the subsequent isotropic etch that removes the sacrificial material layers 42. By terminating the etch process when the bottom surface of each backside contact trench 79 is between the first horizontal plane including the top surface of the bottommost sacrificial material layer 42 and the second horizontal plane including the bottom surface of the sacrificial material layer 42, a process margin is provided to ensure that the bottommost sacrificial material layer 42 is physically exposed to the at least one backside contact trench 79, while the cap gate dielectric layer 126 is not physically exposed to the at least one backside contact trench 79.

Figure 8:
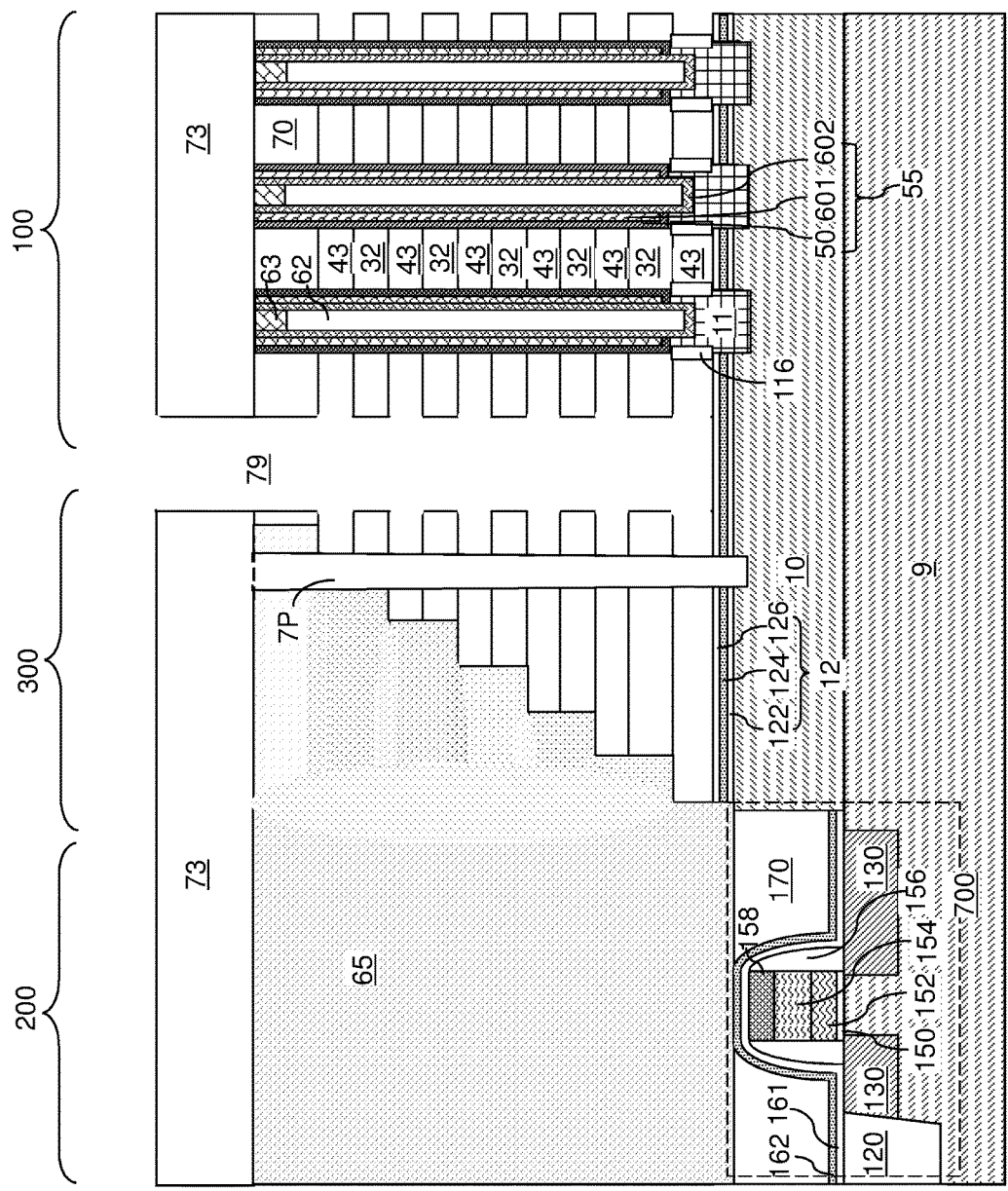
FIG. 8 is a schematic vertical cross-sectional view of the first exemplary structure after formation of backside recesses according to an embodiment of the present disclosure.

Referring to FIG. 8, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one support pillar 7P, the material of the retro-stepped dielectric material portion 65, the material of the cap gate dielectric layer 126, and the material of the outermost layer of the memory films 50. In one embodiment, the sacrificial material layers 42 can include silicon nitride, and the materials of the insulating layers 32, the at least one support pillar 7P, the retro-stepped dielectric material portion 65, and the cap gate dielectric layer 126 can be selected from silicon oxide and dielectric metal oxides. In another embodiment, the sacrificial material layers 42 can include a semiconductor material such as polysilicon, and the materials of the insulating layers 32, the at least one support pillar 7P, the retro-stepped dielectric material portion 65, and the cap gate dielectric layer 126 can be selected from silicon oxide, silicon nitride, and dielectric metal oxides.

In case the charge trapping gate dielectric layer 124 includes a material that is the same as the material of the sacrificial material layers 42 or a material that is etched by the etchant that etches the sacrificial material layers 42, the cap gate dielectric layer 126 prevents the etchant from reaching the charge trapping gate dielectric layer 124. Thus, the presence of the cap gate dielectric layer 126 over the charge trapping gate dielectric layer 124 at the time of the etch process that forms the lateral recesses 43 prevents damage or etching of the charge trapping gate dielectric layer 124.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Upon removal of the sacrificial material layers 42, the bottom surface of each backside contact trench 79 can be flush with the topmost surface of the gate dielectric layer 12, i.e., the top surface of the cap gate dielectric layer 126. Thus, the gate dielectric layer 12 is present between each backside contact trench 79 and the semiconductor material layer 10 of the substrate (9, 10) at this processing step.

Physically exposed surface portions of the optional epitaxial channel portions 11 can be converted into dielectric material portions by thermal conversion and/or plasma conversion into dielectric materials. For example, thermal conversion and/or plasma conversion can be employed to convert a surface portion of each epitaxial channel portion 11 into a tubular dielectric spacer 116. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the epitaxial channel portions 11 and additionally includes at least one non-metallic element such as oxygen and/or nitrogen such that the material of the tubular dielectric spacers 116 is a dielectric material. In one embodiment, the tubular dialectric spacers 116 can include a dielectric oxide, a dielectric nitride, or a dielectric oxynitride of the semiconductor material of the epitaxial channel portions 11.

In one embodiment, the thickness of the gate dielectric layer 12 can increase uniformly due to diffusion of oxygen through the cap gate dielectric layer 126 and the charge trapping gate dielectric layer 124 and into the tunneling gate dielectric layer 122, and conversion of a surface layer of the semiconductor material layer 10 into an additional portion of the tunneling gate dielectric layer 122. In this case, the thickness of the tunneling gate dielectric layer 122 can increase uniformly during formation of the tubular dielectric spacers 116.

Figure 9:
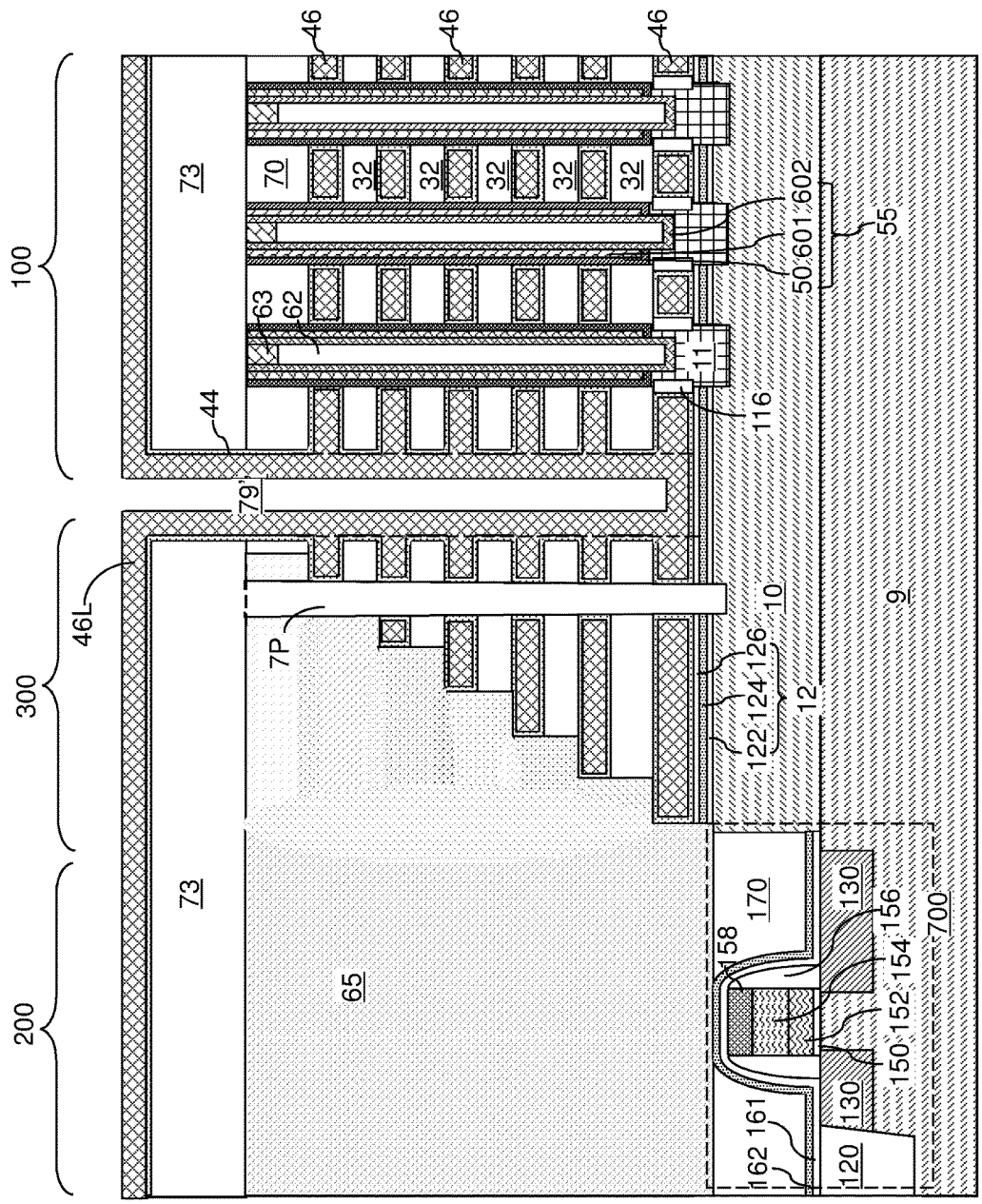
FIG. 9 is a schematic vertical cross-sectional view of the first exemplary structure after formation of electrically conductive layers according to an embodiment of the present disclosure.

Referring to FIG. 9, a backside blocking dielectric layer 44 can be optionally formed. The backside blocking dielectric layer 44, if present, comprises a dielectric material that functions as a portion of a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present. The backside blocking dielectric layer 44 together with the cap gate dielectric layer 126 form a blocking dielectric of the source side select field effect transistor. If the backside blocking dielectric layer 44 is omitted, then the cap gate dielectric layer 126 forms a blocking dielectric of the source side select field effect transistor.

The backside blocking dielectric layer 44 can be formed in the backside recesses 43, on a sidewall of the backside contact trench 79, and on physically exposed sidewalls of the memory stack structures 55 and on the gate electric layer 12. If the backside blocking dielectric layer 44 is formed, formation of the tubular dielectric spacers 116 (i.e., the vertical gate insulating layer of the source side field effect transistor) prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer can include a silicon oxide layer. The backside blocking dielectric layer can be deposited by a conformal deposition method such as chemical vapor deposition or atomic layer deposition. The thickness of the backside blocking dielectric layer can be in a range from 1 nm to 10 nm, although lesser and greater thicknesses can also be employed. The backside blocking dielectric layer is formed on the sidewalls of the at least one backside via trench 79, horizontal surfaces and sidewalls of the insulating layers 32, and the portions of the sidewall surfaces of the memory stack structures 55 that are physically exposed to the backside recesses 43. A backside cavity 79' is present within the portion of each backside via trench 79 that is not filled with the backside blocking dielectric layer.

At least one metallic material can be deposited in the plurality of backside recesses 43, on the sidewalls of the at least one the backside contact trench 79, and over the top surface of the contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material. In one embodiment, the metallic material can be deposited by chemical vapor deposition.

A plurality of electrically conductive layers 46 can be formed in the plurality of backside recesses 43, and a continuous metallic material layer 46L can be formed on the sidewalls of each backside contact trench 79 and over the contact level dielectric layer 73. Thus, each sacrificial material layer 42 can be replaced with an electrically conductive layer 46. A backside cavity 79' is present in the portion of each backside contact trench 79 that is not filled with the backside blocking dielectric layer and the continuous metallic material layer 46L. A tubular dielectric spacer 116 laterally surrounds a semiconductor portion that underlies the lower doped semiconductor portion (e.g., portion 11). A bottommost electrically conductive layer 46 laterally surrounds the tubular dielectric spacer 116 upon formation of the electrically conductive layers 46.

Figure 10:
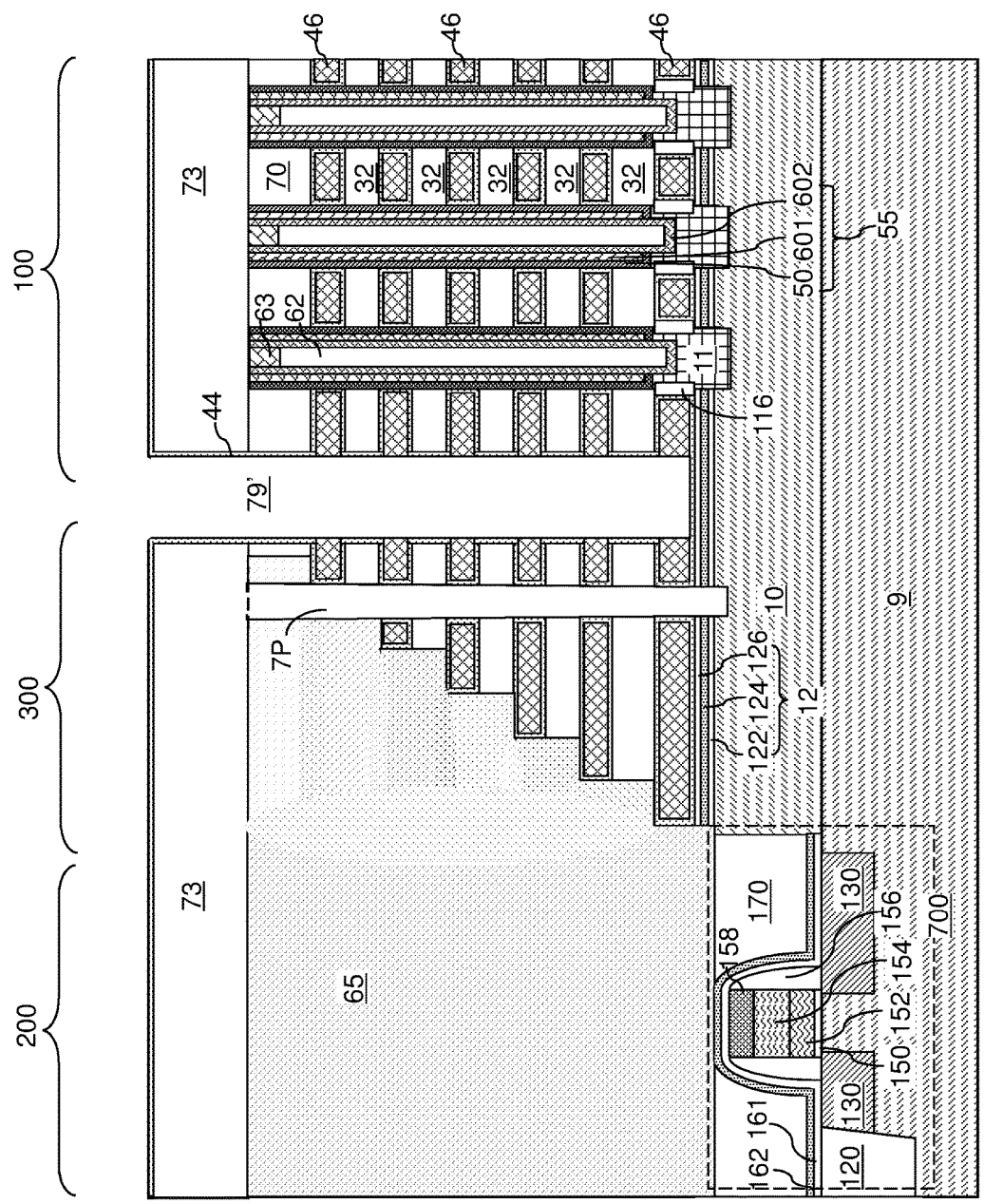
FIG. 10 is a schematic vertical cross-sectional view of the first exemplary structure after removal of a deposited conductive material from within the backside contact trench according to an embodiment of the present disclosure.

Referring to FIG. 10, the deposited metallic material of the continuous electrically conductive material layer 46L is etched back from the sidewalls of each backside contact trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside contact trench 79. The gate dielectric layer 12 can be vertically spaced from the backside contact trench 79 by the horizontal portion of the backside blocking dielectric layer 44.

In another embodiment, the removal of the continuous electrically conductive material layer 46L may not be selective to the material of the backside blocking dielectric layer 44 or, the backside blocking dielectric layer 44 may not be employed. In this case, a top surface and/or sidewall surface of the gate dielectric layer 12 can be physically exposed at the bottom of the backside contact trench 79 depending on whether the gate dielectric layer 12 is not removed or partially removed during removal of the continuous electrically conductive material layer 46L. In one embodiment, a top surface of the cap gate dielectric layer 126 can be physically exposed at the bottom of the backside contact trench 79 after removal of the continuous electrically conductive material layer 46L. A backside cavity 79' is present within each backside contact trench 79.

Figure 11:
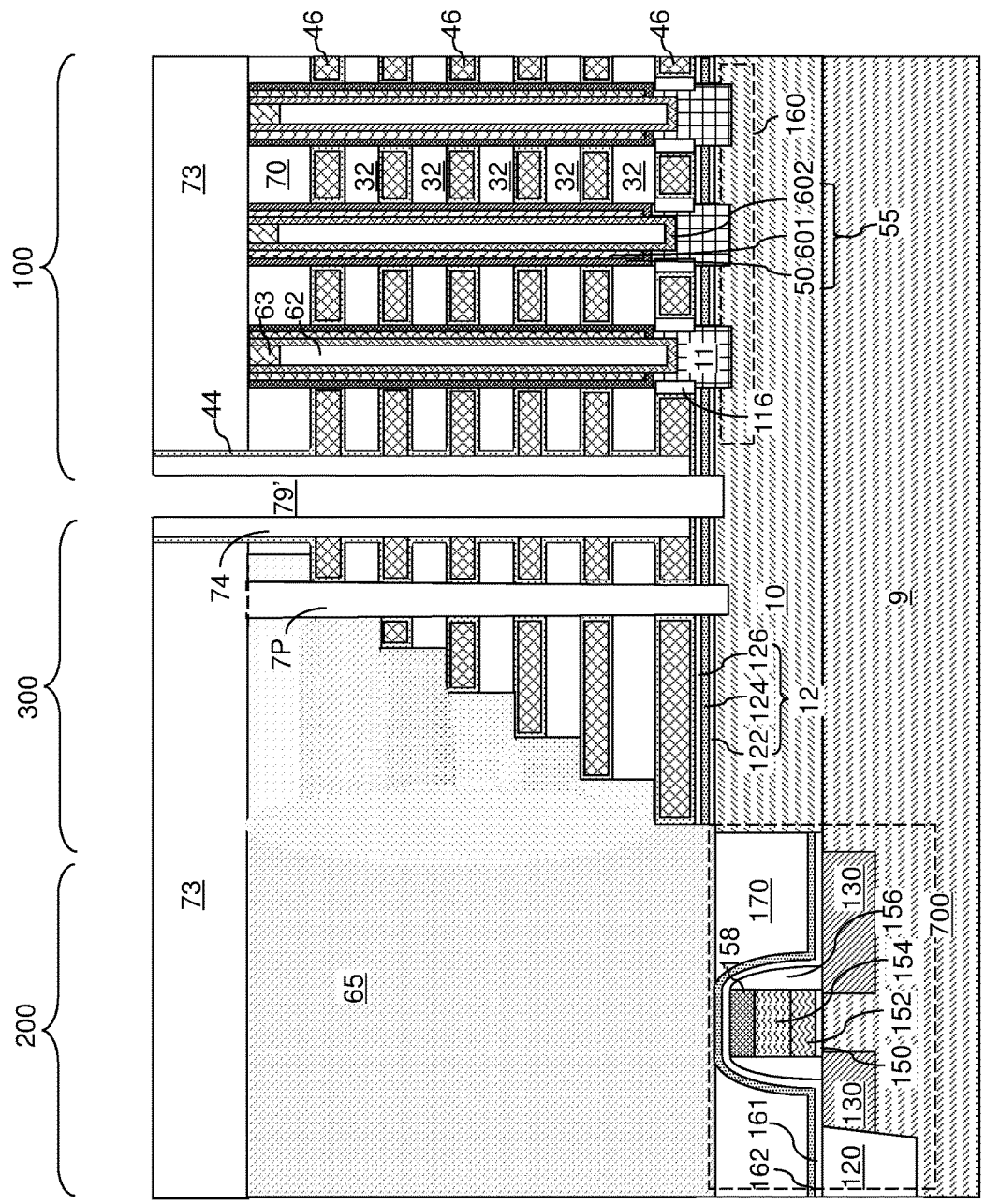
FIG. 11 is a schematic vertical cross-sectional view of the first exemplary structure after formation of an insulating spacer according to an embodiment of the present disclosure.

Referring to FIG. 11, an insulating material layer can be formed in the at least one backside contact trench 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside contact trench 79. Each remaining portion of the insulating material layer constitutes an insulating spacer 74. A backside cavity 79' is present within a volume surrounded by each insulating spacer 74.

The anisotropic etch process can continue with, or without, a change in the etch chemistry to remove portions of the optional backside blocking dielectric layer 44 and the gate dielectric layer 12 that underlies the opening through the insulating spacer 74. An opening is formed though the gate dielectric layer 12 underneath each backside cavity 79', thereby vertically extending the backside cavity 79'. A top surface of the semiconductor material layer 10 can be physically exposed at the bottom of each backside contact trench 79.

Figure 12:
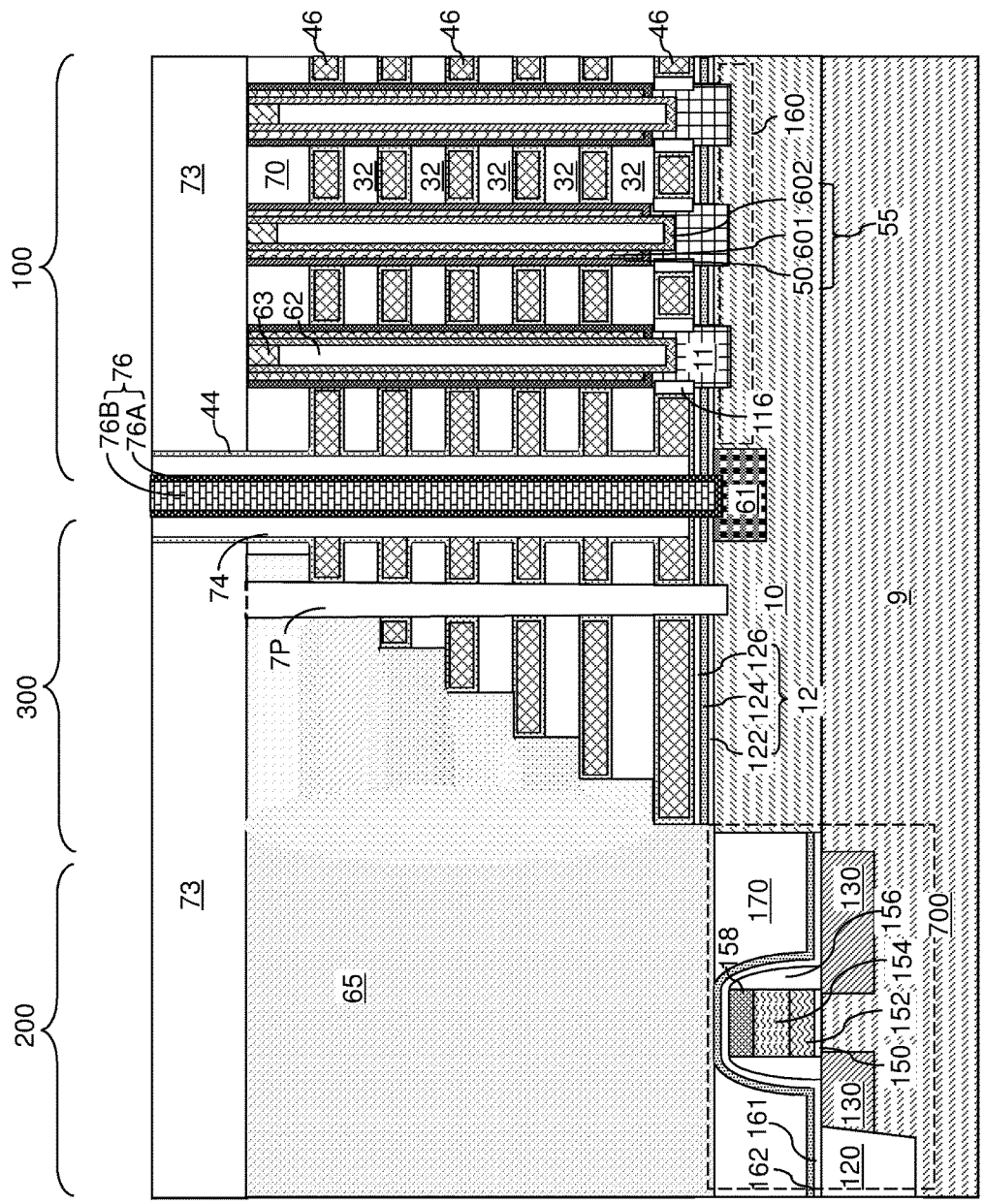
FIG. 12 is a schematic vertical cross-sectional view of the first exemplary structure after formation of a backside contact via structure according to an embodiment of the present disclosure.

Referring to FIG. 12, a source region 61 can be formed at a surface portion of the semiconductor material layer 10 under each backside cavity 79' by implantation of electrical dopants into physically exposed surface portions of the semiconductor material layer 10. Each source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each source region 61 can have a lateral extent greater than the lateral extent of the opening through the insulating spacer 74.

An upper portion of the semiconductor material layer 10 that extends between the source region 61 and the plurality of epitaxial channel portions 11 constitutes a horizontal semiconductor channel 160 for a plurality of field effect transistors (i.e., a channel for one or more source side select field effect transistors for one or more vertical NAND strings). The horizontal semiconductor channel 160 is connected to multiple vertical semiconductor channels 60 through respective epitaxial channel portions 11. The horizontal semiconductor channel 160 contacts the source region 61 and the plurality of epitaxial channel portions 11. A bottommost electrically conductive layer 46 provided upon formation of the electrically conductive layers 46 within the alternating stack (32, 46) can comprise a source side select gate electrode for the field effect transistors (i.e., the source side select field effect transistors for the vertical NAND strings).

A contact via structure 76 can be formed within each cavity 79'. Each contact via structure 76 can fill a respective cavity 79'. The contact via structures 76 can be formed by depositing at least one conductive material in the remaining unfilled volume (i.e., the backside cavity 79') of the backside contact trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside contact trenches 79 constitutes a backside contact via structure 76. Each contact via structure 76 can be formed directly on a top surface of a source region 61, and can contact sidewalls of the component layers (122, 124, 126) of the gate dielectric layer 12.

The backside contact via structure 76 extends through the alternating stack (32, 46) and an opening in the gate dielectric layer 12, and contacts a top surface of the source region 61. If a backside blocking dielectric layer 44 is employed, the backside contact via structure 76 can contact a sidewall of the backside blocking dielectric layer 44. In one embodiment, the bottom surface of the insulating spacer 74 can be vertically spaced from the source region 61 by the layer stack including the tunneling gate dielectric layer 122, the charge trapping gate dielectric layer 124, the cap gate dielectric layer 126, and the optional backside blocking dielectric layer 44.

Figure 13:
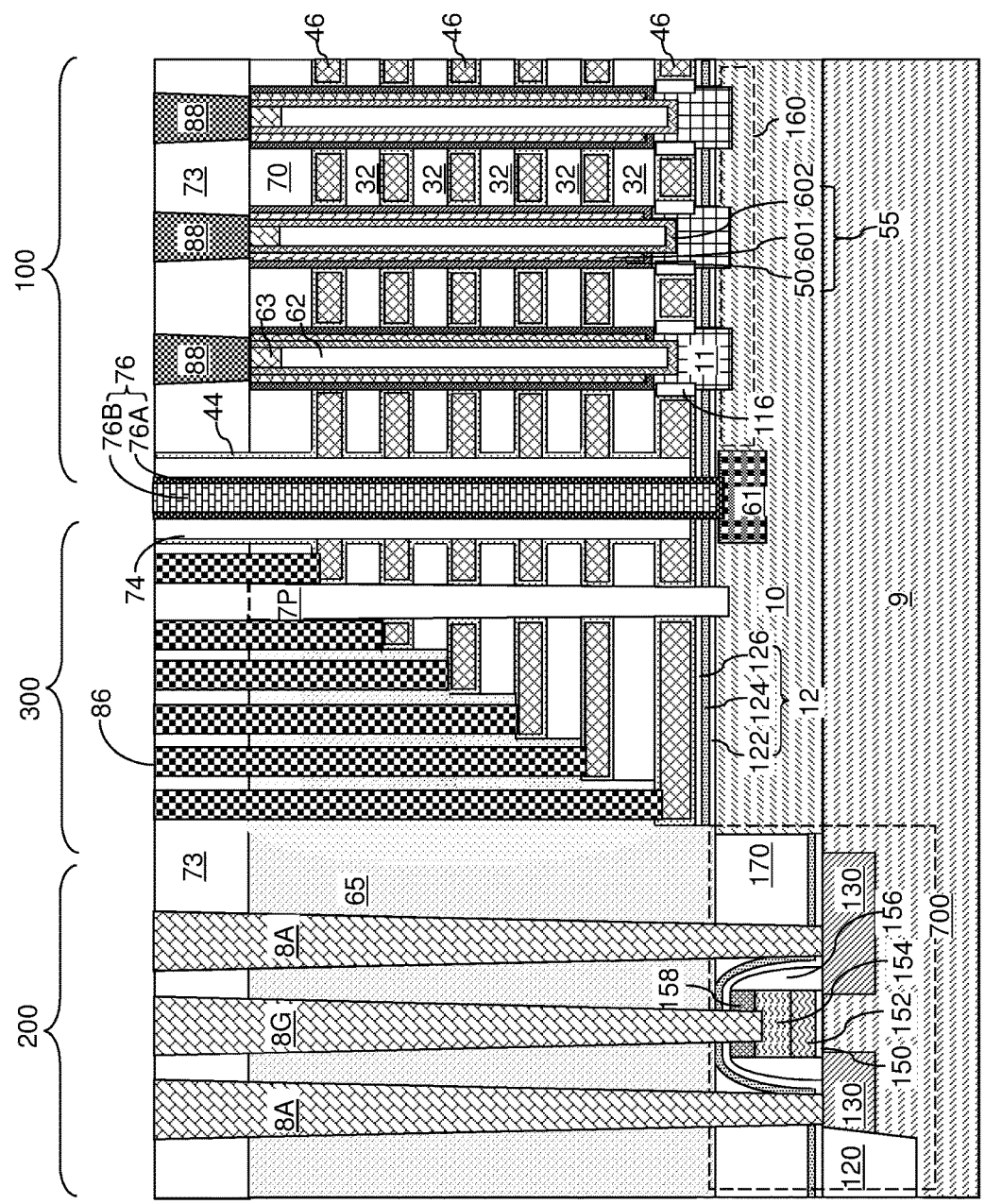
FIG. 13 is a schematic vertical cross-sectional view of the first exemplary structure after formation of additional contact via structures according to an embodiment of the present disclosure.

Referring to FIG. 13, additional contact via structures (88, 86, 8A, 8G) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 through the contact level dielectric layer 73, and through the retro-stepped dielectric material portion 65. Peripheral gate contact via structures 8G and peripheral active region contact via structures 8A can be formed through the retro-stepped dielectric material portion 65 directly on respective nodes of the peripheral devices.

While an embodiment is illustrated herein in which the spacer material layers are formed as sacrificial material layers 42 and are subsequently replaced with electrically conductive layers 46, embodiments are expressly contemplated herein in which the spacer material layers are formed as electrically conductive layers 46. In this case, the processing steps employed to form, or fill, lateral recesses can be omitted.

Figure 14:
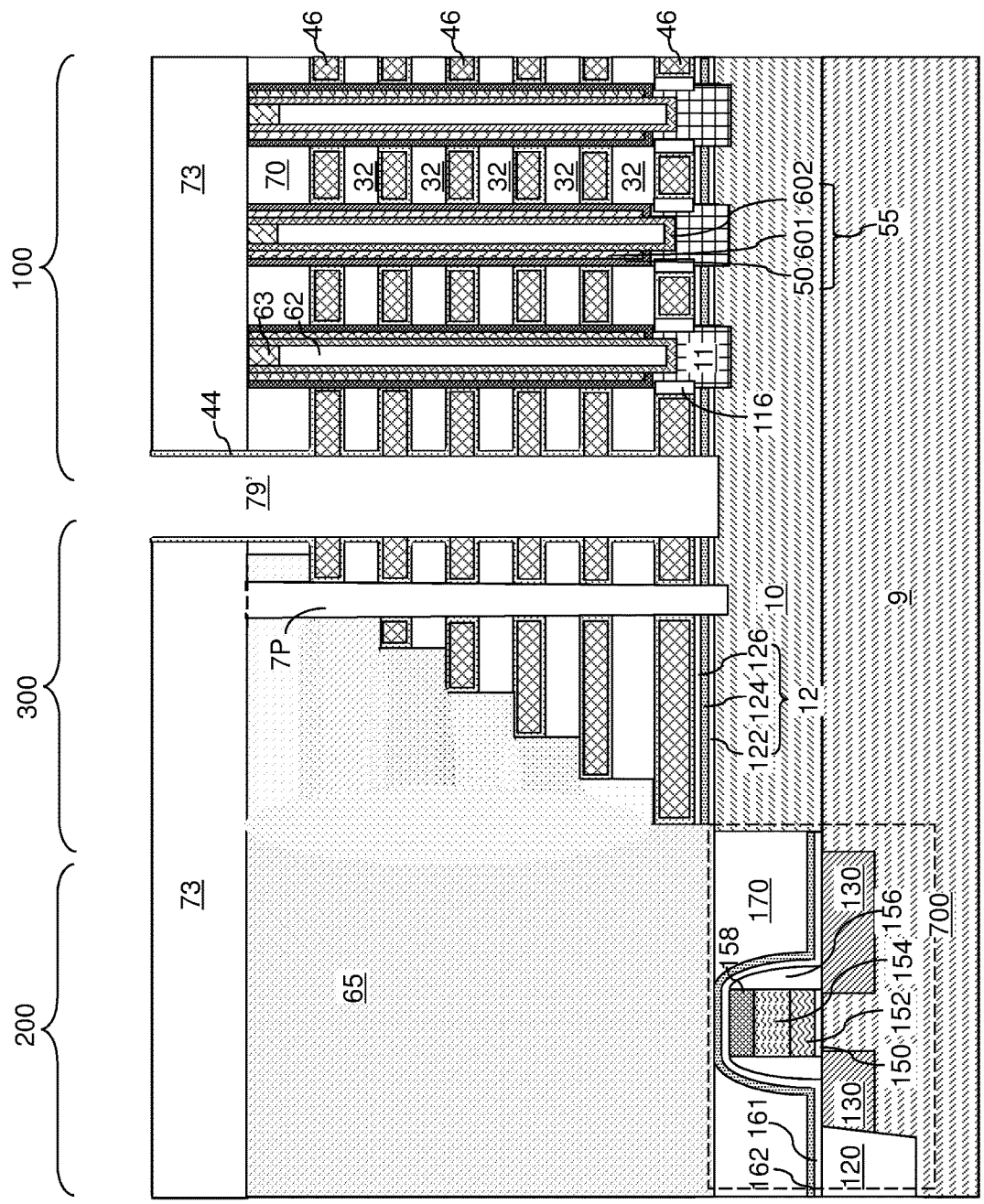
FIG. 14 is a schematic vertical cross-sectional view of a second exemplary structure after removal of a deposited conductive material from within the backside contact trench and extension of the backside contact trench according to an embodiment of the present disclosure.

Referring to FIG. 14, a second exemplary structure according to a second embodiment of the present disclosure is illustrated. The second embodiment differs from the first embodiment in that the etch process which removes the gate dielectric layer 12 is performed before formation of the insulating spacer 74 rather than after formation of the insulating spacer 74 as in the first embodiment. The second exemplary structure can be derived from the first exemplary structure of FIG. 10 by performing an anisotropic etch process that removes horizontal portions of the backside blocking dielectric layer 44, if present, and by performing an etch process that removes the portion of the gate dielectric layer 12 underlying each backside cavity 79'. For example, an anisotropic etch process can be employed to sequentially remove portions of the cap gate dielectric layer 126, the charge trapping gate dielectric layer 124, and the tunneling gate dielectric layer 122 from underneath each backside cavity 79'. A top surface of the semiconductor material layer 10 can be physically exposed at the bottom of each backside cavity 79'.

Figure 15:
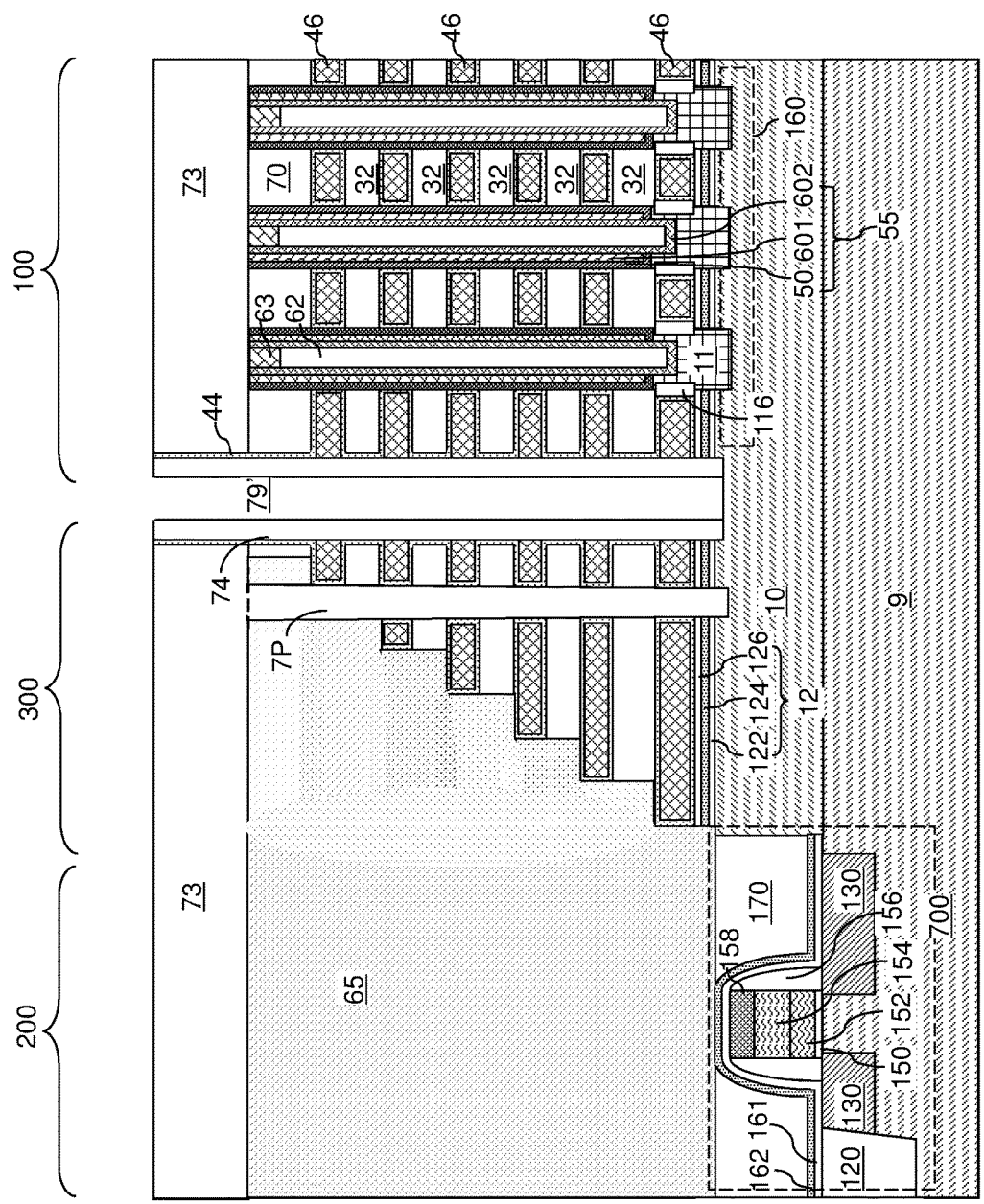
FIG. 15 is a schematic vertical cross-sectional view of the second exemplary structure after formation of an insulating spacer according to an embodiment of the present disclosure.

Referring to FIG. 15, the processing steps of FIG. 11 can be performed to form an insulating spacer 74 at a periphery of each backside cavity 79'. Each insulating spacer 74 can contact a top surface of the semiconductor material layer 10, sidewalls of the electrically conductive layers 46 and a sidewall of the gate dielectric layer 12. Specifically, each insulating spacer 74 contacts sidewalls of the layer stack including the tunneling gate dielectric layer 122, the charge trapping gate dielectric layer 124, the cap gate dielectric layer 126, and the optional backside blocking dielectric layer 44. If the backside blocking dielectric layer 44 is present, each insulating spacer 74 contacts sidewalls of the backside blocking dielectric layer 44. If the backside blocking dielectric layer 44 is not present, each insulating spacer 74 contacts sidewalls of the insulating layers.

Figure 16:
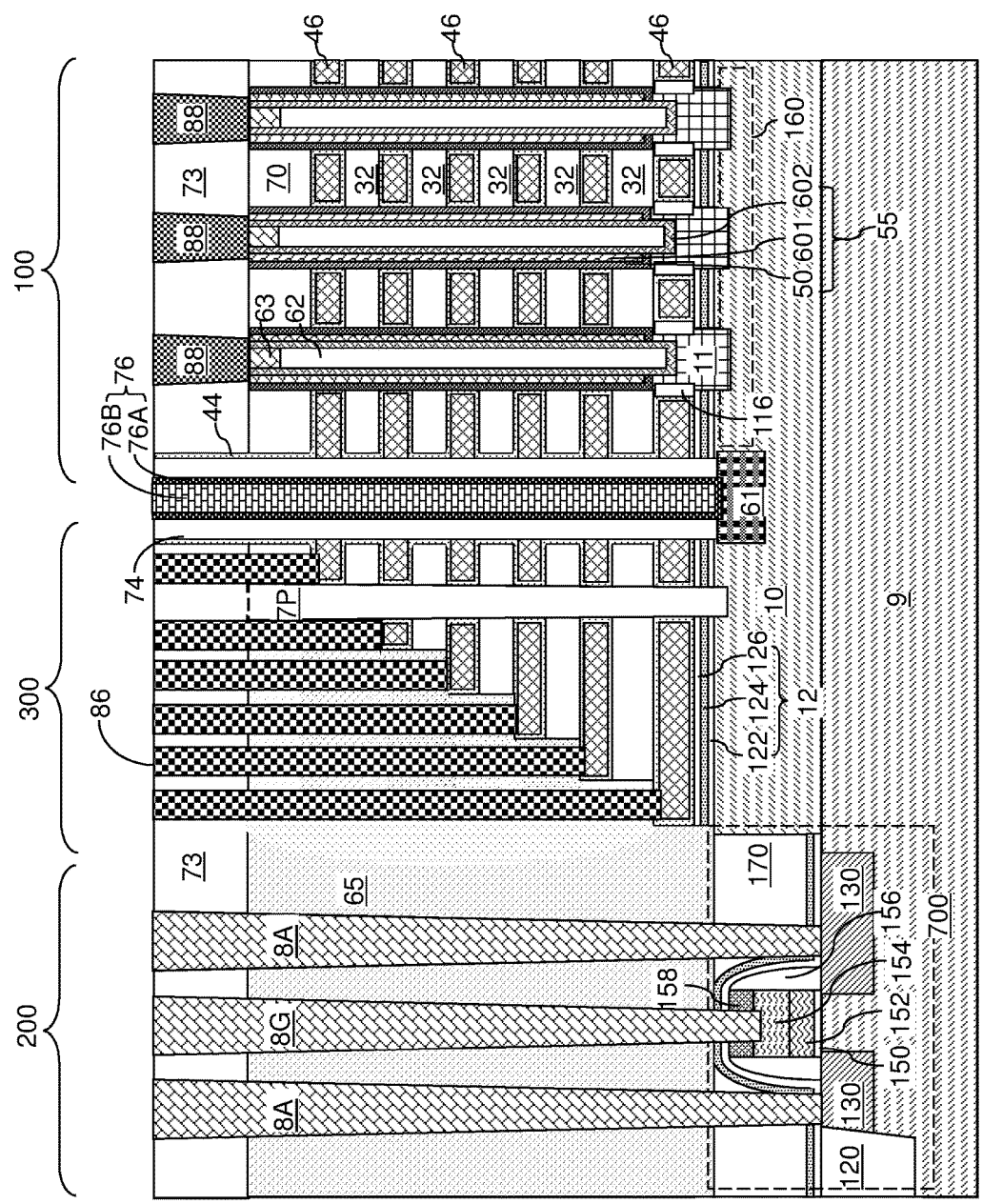
FIG. 16 is a schematic vertical cross-sectional view of the second exemplary structure after formation of a backside contact via structure and additional contact via structures according to an embodiment of the present disclosure.

Referring to FIG. 16, the processing steps of FIGS. 12 and 13 can be performed to form a backside contact via structure 76 within each backside cavity 79', and to form additional contact via structures (88, 86, 8A, 8G).

Figure 17:
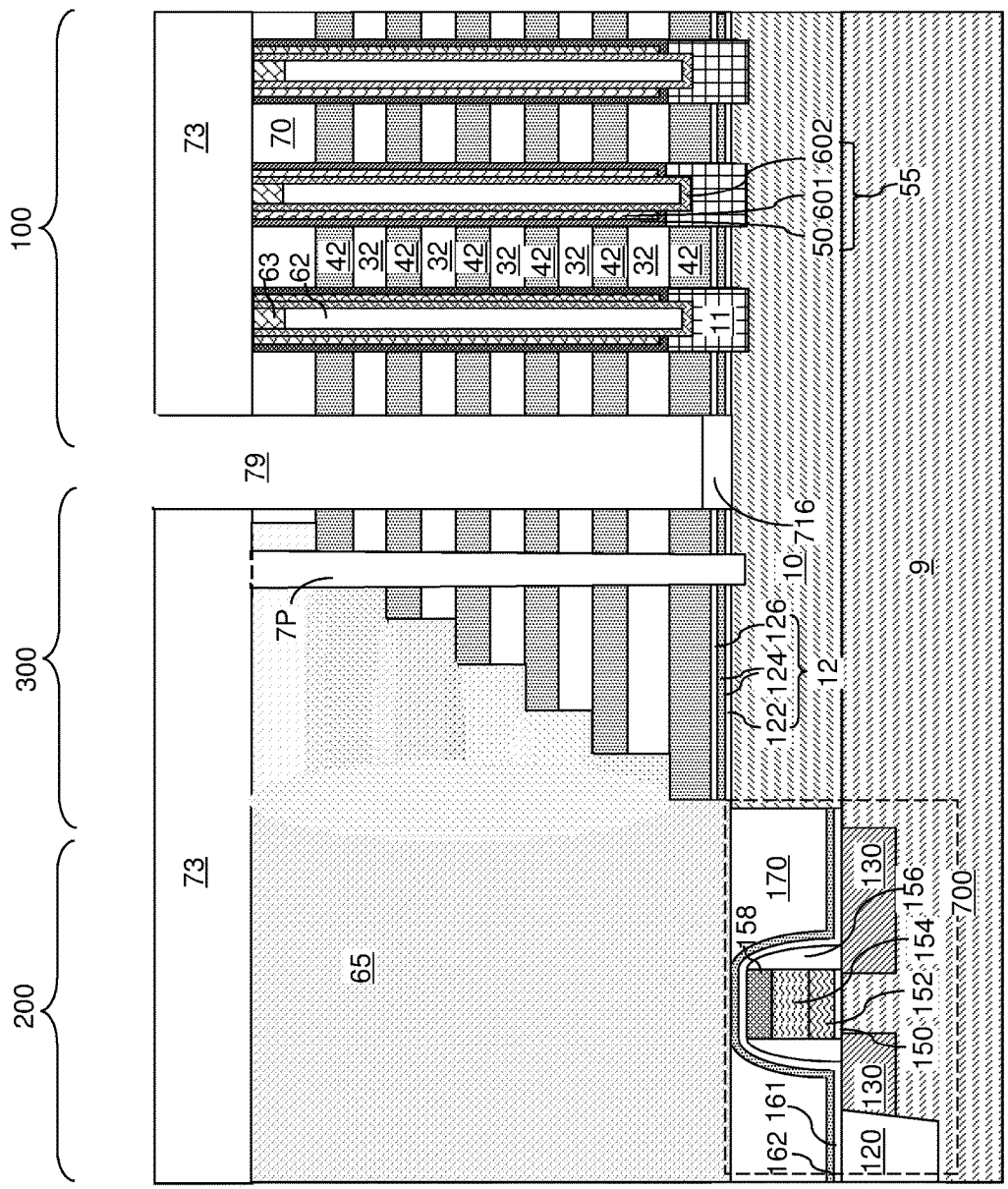
FIG. 17 is a schematic vertical cross-sectional view of a third exemplary structure after formation of a dielectric

Referring to FIG. 17, a third exemplary structure according to a third embodiment of the present disclosure can be derived from the first exemplary structure of FIGS. 7A and 7B by extending each backside contact trench through the bottommost sacrificial material layer 42 and the gate dielectric layer 12, and by anisotropically depositing a dielectric protective material 716. The dielectric protective material is a dielectric material that can protect the materials of the charge trapping gate dielectric layer 124 during a subsequent etch process to be employed to form lateral recesses. For example, if the sacrificial material layers 42 include silicon nitride and if the charge trapping gate dielectric layer 124 includes silicon nitride, the dielectric protective material can be silicon oxide such as undoped silicate glass.

The dielectric protective material 716 may be formed by oxidizing the semiconductor material layer (e.g., silicon) to form an oxide of the semiconductor material layer (e.g., silicon oxide). The thickness of the protective dielectric material portion 716 is selected such that sidewalls of the charge trapping gate dielectric layer 124 are entirely covered with the protective dielectric material portion 716.

Figure 18:
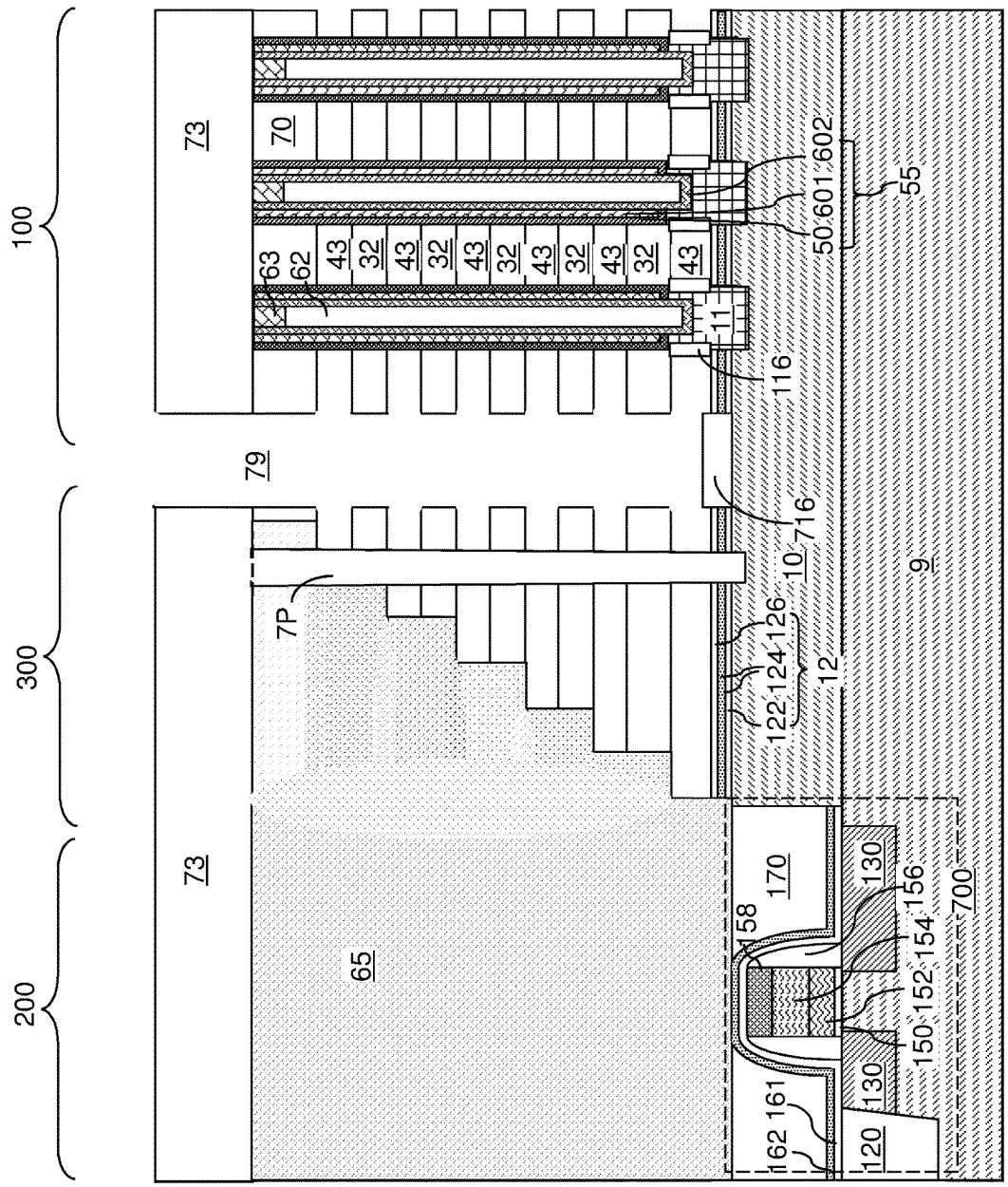
FIG. 18 is a schematic vertical cross-sectional view of the third exemplary structure after formation of backside recesses according to an embodiment of the present disclosure.

Referring to FIG. 18, the processing steps of FIG. 8 can be performed to remove the sacrificial material layers 42 selective to the insulating layers 32, the cap gate dielectric layer 126, and the protective dielectric material portion 716. Tubular dielectric spacers 116 can be formed around the epitaxial channel portions 11 employing the processing steps of FIG. 8.

Figure 19:
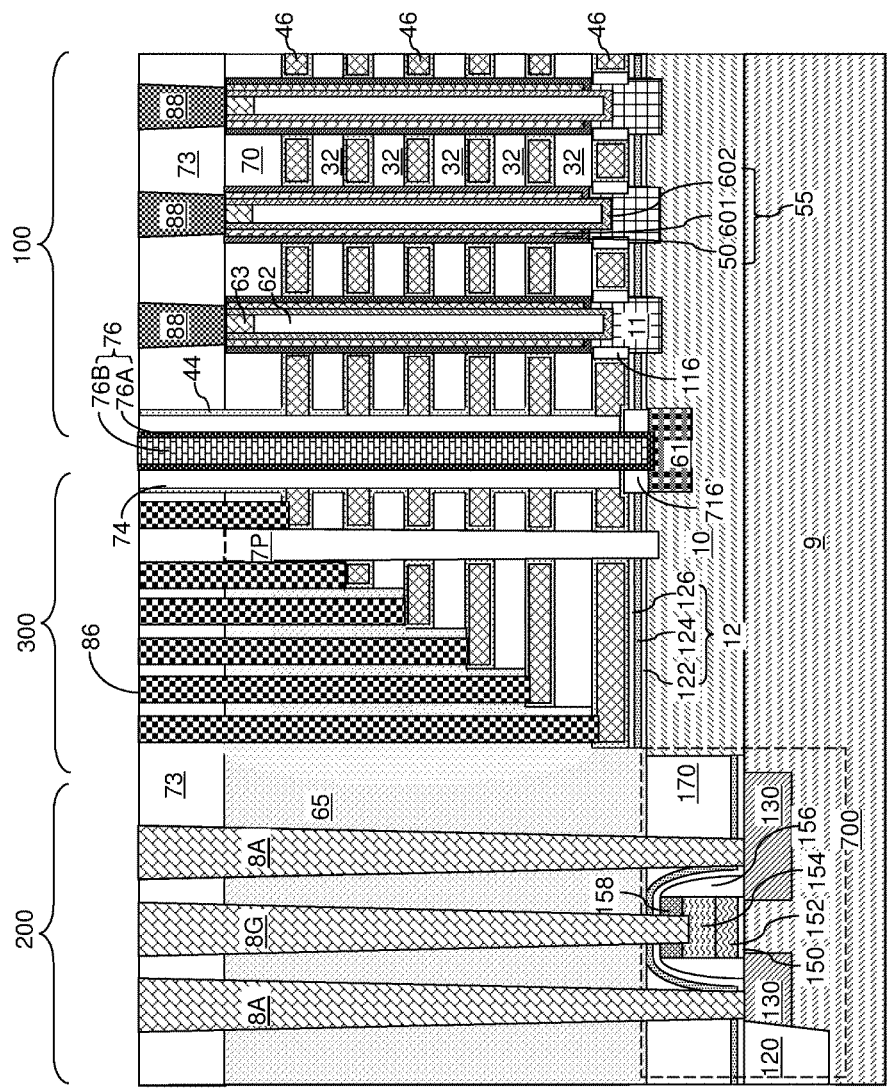
FIG. 19 is a schematic vertical cross-sectional view of the third exemplary structure after formation of additional contact via structures according to an embodiment of the present disclosure.

Referring to FIG. 19, the processing steps of FIGS. 9-11 can be performed to form an optional backside blocking dielectric layer 44, electrically conductive layers 46, and an insulating spacer 74. The protective dielectric material portion 716 may be entirely removed after removal of the continuous metallic material layer 46L and prior to formation of the insulating spacer 74 employing an anisotropic etch. In this case, the insulating spacer 74 can contact a top surface of the semiconductor material layer 10 upon formation, and can contact a source region 61 upon formation of the source region 61. Alternatively, removal of the continuous metallic material layer 46L may be selective to the optional backside blocking dielectric layer 44 or the protective dielectric material portion 716. In this case, an annular bottom surface of the insulating spacer 74 can contact a horizontal portion of the backside blocking dielectric layer 44 or a top surface of a remaining annular portion of the protective dielectric material portion 716, which is herein referred to as an annular dielectric spacer 716'.

Subsequently, the processing steps of FIG. 12 can be performed to form a source region 61 underneath each backside cavity 79' and a backside contact via structure 76 within each backside cavity 79'. Additional contact via structures (88, 86, 8A, 8G) can be subsequently formed by performing the processing steps of FIG. 13.

The various exemplary structures of the present disclosure can include a three-dimensional memory device. The three-dimensional memory device can include an alternating stack (32, 46) of insulating layers 32 and electrically conductive layers 46 located over a substrate (9, 10); memory stack structures 55 extending through the alternating stack (32, 46), each of the memory stack structures 55 comprising a memory film 50 and a vertical semiconductor channel 60; a semiconductor material layer 10 located in an upper portion of the substrate (9, 10) and including a horizontal semiconductor channel 160 underlying a top surface of the semiconductor material layer 10; and a gate dielectric layer 12 contacting the top surface of the semiconductor material layer 10 and including, from bottom to top, a tunneling gate dielectric layer 122, a charge trapping gate dielectric layer 124, and a cap gate dielectric layer 126. A bottommost electrically conductive layer 46 comprises a select gate electrode for a field effect transistor including the horizontal semiconductor channel 160 as a portion of a channel.

In one embodiment, the tunneling gate dielectric layer 122 comprises a material selected from silicon oxide and silicon oxynitride, and the charge trapping gate dielectric layer 124 comprises silicon nitride. In one embodiment, the memory film 55 comprises a different layer stack than the gate dielectric layer 12. In one embodiment, the memory film 50 comprises a stack, from outside to inside, of a blocking dielectric layer 52, a memory material layer 54, and a tunneling dielectric layer 56 that differs from the tunneling gate dielectric layer 122 by at least one of composition and thickness. In one embodiment, the memory material layer 54 differs from the charge trapping gate dielectric layer 124 by at least one of composition and thickness. In one embodiment, the blocking dielectric layer 56 differs from the cap gate dielectric layer 126 by at least one of composition and thickness.

In one embodiment, the horizontal semiconductor channel 160 comprises a single crystalline semiconductor material (e.g., single crystalline silicon), and the vertical semiconductor channel 60 comprises a polycrystalline semiconductor material (e.g., polysilicon). In one embodiment, each vertical semiconductor channel 60 contacts an epitaxial channel portion 11 comprising another single crystalline semiconductor material, laterally surrounded by the select gate electrode (as embodied as the bottommost electrically conductive layer 46), and is laterally spaced from the select gate electrode by a respective tubular dielectric spacer 116 (i.e., the gate insulating layer of the source side select field effect transistor which does not have the charge trapping dielectric such as silicon nitride). Thus, charge is preferably not stored between the epitaxial channel portion 11 and the source side select gate electrode 46 of the source side select field effect transistor. In one embodiment, each tubular dielectric spacer 116 comprises a dielectric oxide of a semiconductor material of the epitaxial channel portion 11, and is adjoined to the cap gate dielectric layer 126 and to a bottommost insulating layer 32 within the alternating stack (32, 46). Therefore, charge is preferably stored on the bottom side of the bottom source side select gate electrode 46 of the source side select field effect transistor in layer 124 but not on the edge side of the source side select gate electrode 46 of the source side select field effect transistor in the spacer 116.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layers 46 within the alternating stack (32, 46), and the terrace region includes stepped surfaces of the alternating stack (32, 46) that continuously extend from a bottommost layer within the alternating stack (32, 46) to a topmost layer within the alternating stack (32, 46). In one embodiment, the three-dimensional memory device can further comprise a retro-stepped dielectric material portion 65 contacting the stepped surfaces of the alternating stack (32, 46) and contacting sidewalls of the cap gate dielectric layer 126 and the charge trapping gate dielectric layer 124.

In one embodiment, a backside blocking dielectric layer 44 can continuously extend from a topmost layer within the alternating stack (32, 46) to the gate dielectric layer 12 and vertically spaces each neighboring pair of an electrically conductive layer 46 and an insulating layer 32 within the alternating stack (32, 46). The backside blocking dielectric layer 44 may act as part of the blocking dielectric for the source side select field effect transistor. A source region 61 can be located at a surface portion of the semiconductor material layer 10 and can contact the horizontal semiconductor channel 160. A backside contact via structure 76 can extend through the alternating stack (32, 46) and an opening in the gate dielectric layer 12, and can contact a top surface of the source region 61.

In one embodiment, the three-dimensional memory device comprises a vertical NAND device located over the substrate (9, 10). The electrically conductive layers 46 can comprise, or can be electrically connected to, a respective word line of the NAND device. The substrate can comprise a silicon substrate. The vertical NAND device can comprise an array of monolithic three-dimensional NAND strings over the silicon substrate. At least one memory cell in a first device level of the array of monolithic three-dimensional NAND strings can be located over another memory cell in a second device level of the array of monolithic three-dimensional NAND strings. The silicon substrate can contain an integrated circuit comprising a driver circuit for the memory device located thereon.

In one embodiment, the array of monolithic three-dimensional NAND strings comprises: a plurality of semiconductor channels (160, 11, 60), wherein at least one end portion of each of the plurality of semiconductor channels, i.e., each vertical semiconductor channel 60, extends substantially perpendicular to a top surface of the substrate (9, 10); a plurality of charge storage elements (as embodied as portions of the memory material layer 54 located at levels of the electrically conductive layers 46), each charge storage element located adjacent to a respective one of the plurality of semiconductor channels (i.e., a vertical semiconductor channel 60); and a plurality of control gate electrodes (as embodied as a subset of the electrically conductive layers 46) having a strip shape extending substantially parallel to the top surface of the substrate (9, 10), the plurality of control gate electrodes comprise at least a first control gate electrode located in a first device level and a second control gate electrode located in a second device level.

The charge trapping capability of the charge trapping gate dielectric layer 124 enables operation of the three-dimensional memory device of the present disclosure in multiple modes in which a source-side select gate electrode (as embodied as the bottommost electrically conductive layer 46) operate with different threshold voltages. Specifically, electrical charges can be injected through the tunneling gate dielectric layer 122 into the charge trapping gate dielectric layer 124 by electrically biasing the select gate electrode with respect to the horizontal semiconductor channel 160 (e.g., with respect to the source 61 or drain 63 regions). Trapped electrical charges (e.g., electrons) in the charge trapping gate dielectric layer 124 can alter (e.g., increase) the threshold voltage the horizontal semiconductor channel 160 of the source side select field effect transistor. In a subsequent operation, the source side select field effect transistor may be turned on or off based on a select gate bias voltage applied to the select gate electrode without removing the charges stored in layer 124. If desired, the charges stored in layer 124 may be removed (i.e., erased) and/or refreshed during operation of the device.

In one embodiment, the programmable select gate electrode can provide an increased threshold voltage for controlling the current flow through the horizontal portion of the semiconductor channel, i.e., through the horizontal semiconductor channel 160 upon injection of electrical charges (such as electrons) during the operation of the three-dimensional memory device. The increase in the threshold voltage can enhance isolation of word lines during operation of the three-dimensional memory device. For example, program disturb in unselected word lines (which may be caused by a leakage current between memory stack structures 55 through an unselected word line) due to low threshold voltage and short channel effect can be minimized by the increase in the threshold voltage of the source-side select gate transistor.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
an alternating stack of insulating layers and electrically conductive layers located over a substrate, wherein a bottommost electrically conductive layer comprises a select gate electrode of a select field effect transistor of the memory device;
memory stack structures extending through the alternating stack, each of the memory stack structures comprising a memory film and a vertical semiconductor channel;
a horizontal semiconductor channel of the select field effect transistor underlying the select gate electrode; and
a gate dielectric layer contacting the top surface of the horizontal semiconductor channel, and comprising from bottom to top, a tunneling gate dielectric layer, a charge trapping gate dielectric layer, and a cap gate dielectric layer.

2. The three-dimensional memory device of claim 1, wherein:
the tunneling gate dielectric layer comprises a material selected from silicon oxide and silicon oxynitride; and
the charge trapping gate dielectric layer comprises silicon nitride.

3. The three-dimensional memory device of claim 1, wherein the memory film comprises a different layer stack than the gate dielectric layer.

4. The three-dimensional memory device of claim 1, wherein:
the memory film comprises a stack, from outside to inside, of a blocking dielectric layer, a memory material layer, and a tunneling dielectric layer that differs from the tunneling gate dielectric layer by at least one of composition and thickness; and
the memory material layer differs from the charge trapping gate dielectric layer by at least one of composition and thickness.

5. The three-dimensional memory device of claim 1, wherein:
the select field effect transistor comprises a source side select field effect transistor of a vertical NAND string; and
charges stored in the charge trapping gate dielectric layer increase the threshold voltage of the horizontal channel of the source side select field effect transistor.

6. The three-dimensional memory device of claim 1, wherein:
the horizontal semiconductor channel comprises a single crystalline semiconductor material; and
the vertical semiconductor channel comprises a polycrystalline semiconductor material.

7. The three-dimensional memory device of claim 6, wherein each vertical semiconductor channel contacts an epitaxial channel portion comprising another single crystalline semiconductor material, laterally surrounded by the select gate electrode, and is laterally spaced from the select gate electrode by gate insulating layer comprising a respective tubular dielectric spacer which lacks a charge trapping dielectric layer.

8. The three-dimensional memory device of claim 7, wherein each tubular dielectric spacer comprises a dielectric oxide of a semiconductor material of the epitaxial channel portion, and is adjoined to the cap gate dielectric layer and to a bottommost insulating layer within the alternating stack.

9. The three-dimensional memory device of claim 1, wherein the alternating stack comprises a terrace region in which each electrically conductive layer other than a topmost electrically conductive layer within the alternating stack laterally extends farther than any overlying electrically conductive layers within the alternating stack, and the terrace region includes stepped surfaces of the alternating stack that continuously extend from a bottommost layer within the alternating stack to a topmost layer within the alternating stack.

10. The three-dimensional memory device of claim 9, further comprising a retro-stepped dielectric material portion contacting the stepped surfaces of the alternating stack and contacting sidewalls of the cap gate dielectric layer and the charge trapping gate dielectric layer.

11. The three-dimensional memory device of claim 1, further comprising a backside blocking dielectric layer continuously extending from a topmost layer within the alternating stack to the gate dielectric layer and vertically spacing each neighboring pair of an electrically conductive layer and an insulating layer within the alternating stack.

12. The three-dimensional memory device of claim 1, further comprising:
a source region located at a surface portion of the substrate and contacting the horizontal semiconductor channel; and
a backside contact via structure extending through the alternating stack and an opening in the gate dielectric layer and contacting a top surface of the source region.

13. The three-dimensional memory device of claim 1, wherein:
the three-dimensional memory device comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in a first device level and a second control gate electrode located in a second device level.

14. A method of operating a three-dimensional memory device of claim 1, comprising injecting electrical charges through the tunneling gate dielectric layer into the charge trapping gate dielectric layer by electrically biasing the select gate electrode with respect to the horizontal semiconductor channel, wherein trapped electrical charges in the charge trapping gate dielectric layer alter a threshold voltage of the horizontal semiconductor channel.

15. A method of forming a three-dimensional memory device, comprising:
providing a substrate including a semiconductor material layer in an upper portion thereof;
forming a gate dielectric layer directly on a top surface of the semiconductor material layer, wherein the gate dielectric layer includes, from bottom to top, a tunneling gate dielectric layer, a charge trapping gate dielectric layer, and a cap gate dielectric layer;
forming an alternating stack of insulating layers and spacer material layers over the gate dielectric layer; and
forming memory stack structures comprising a memory film and a vertical semiconductor channel through the alternating stack;
wherein:
the spacer material layers are formed as, or subsequently replaced with, electrically conductive layers;
an upper portion of the semiconductor material layer comprises a horizontal semiconductor channel for a select field effect transistor of the memory device; and
a bottommost electrically conductive layer provided upon formation of the electrically conductive layers within the alternating stack comprises a select gate electrode for the select field effect transistor.

16. The method of claim 15, wherein:
the tunneling gate dielectric layer comprises a material selected from silicon oxide and silicon oxynitride; and
the charge trapping gate dielectric layer comprises silicon nitride.

17. The method of claim 15, wherein:
the select field effect transistor comprises a source side select field effect transistor of a vertical NAND string;
the memory film comprises a stack, from outside to inside, of a blocking dielectric layer, a memory material layer, and a tunneling dielectric layer that differs from the tunneling gate dielectric layer by at least one of composition and thickness; and
the memory material layer differs from the charge trapping gate dielectric layer by at least one of composition and thickness.

18. The method of claim 15, further comprising injecting electrical charges through the tunneling gate dielectric layer into the charge trapping gate dielectric layer by electrically biasing the select gate electrode with respect to the horizontal semiconductor channel, wherein trapped electrical charges in the charge trapping gate dielectric layer alter a threshold voltage of the horizontal semiconductor channel.

19. The method of claim 15, further comprising:
forming a source region at a surface portion of the semiconductor material layer, wherein the horizontal semiconductor channel contacts the source region; and
forming a backside contact via structure through the alternating stack and an opening in the gate dielectric layer and on a top surface of the source region.

20. The method of claim 15, further comprising:
forming memory openings through the alternating stack and the gate dielectric layer; and
forming an epitaxial channel portion at a bottom of each memory opening, wherein the memory stack structures are formed over a respective epitaxial channel portion.

21. The method of claim 20, wherein:
the spacer material layers comprise sacrificial material layers that are removed to form backside recesses; and
the method further comprises converting surface portions of the epitaxial channel portions into respective tubular dielectric spacers after formation of the backside recesses and prior to formation of the electrically conductive layers.

22. The method of claim 21, further comprising forming a backside blocking dielectric layer in the backside recesses on physically exposed sidewalls of the memory stack structures and on the gate electric layer, wherein the electrically conductive layers are formed directly on the backside blocking dielectric layer.

23. The method of claim 15, further comprising:
patterning the alternating stack to form a terrace region in which each spacer material layer other than a topmost spacer material layer within the alternating stack laterally extends farther than any overlying spacer material layers within the alternating stack, and the terrace region includes stepped surfaces of the alternating stack that continuously extend from a bottommost layer within the alternating stack to a topmost layer within the alternating stack; and forming a retro-stepped dielectric material portion contacting the stepped surfaces of the alternating stack and contacting sidewalls of the cap gate dielectric layer and the charge trapping gate dielectric layer.

24. The method of claim 15, wherein:

the three-dimensional memory device comprises a vertical NAND device located over the substrate;

the electrically conductive layers comprise, or are electrically connected to, a respective word line of the NAND device;

the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:

a plurality of semiconductor channels, wherein at least one end portion of each of the plurality of semiconductor channels extends substantially perpendicular to a top surface of the substrate;

a plurality of charge storage elements, each charge storage element located adjacent to a respective one of the plurality of semiconductor channels; and a plurality of control gate electrodes having a strip shape extending substantially parallel to the top surface of the substrate, the plurality of control gate electrodes comprise at least a first control gate electrode located in a first device level and a second control gate electrode located in a second device level.

* * * * *